United States Patent
Jacobson et al.

(10) Patent No.: US 7,484,143 B1
(45) Date of Patent: *Jan. 27, 2009

(54) SYSTEM AND METHOD FOR PROVIDING TESTING AND FAILURE ANALYSIS OF INTEGRATED CIRCUIT MEMORY DEVICES

(75) Inventors: Lee James Jacobson, Cape Elizabeth, ME (US); Todd Wayne Karry, Kennebunk, ME (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/800,656

(22) Filed: May 7, 2007

Related U.S. Application Data

(63) Continuation of application No. 10/846,004, filed on May 14, 2004, now Pat. No. 7,216,270.

(51) Int. Cl.
*G11C 29/44* (2006.01)
*G11C 29/50* (2006.01)

(52) U.S. Cl. .................................. 714/718; 714/724

(58) Field of Classification Search .................. None
See application file for complete search history.

(56) References Cited

U.S. PATENT DOCUMENTS

| 4,715,034 A | 12/1987 | Jacobson |
| 5,491,665 A | 2/1996 | Sachdev |
| 5,977,558 A | 11/1999 | Lee |
| 6,519,725 B1 | 2/2003 | Huisman et al. |
| 7,216,270 B1 * | 5/2007 | Jacobson et al. ............ 714/718 |
| 2004/0015756 A1 | 1/2004 | Chiu et al. |

* cited by examiner

*Primary Examiner*—John P Trimmings
*Assistant Examiner*—Dipakkumar Gandhi

(57) ABSTRACT

A system and method is disclosed for testing integrated circuits that contain memory devices. A plurality of test circuits is created in which each test circuit incorporates a physical fault in a memory bit cell. Each of the test circuits generates a distinct electrical signature that is due to presence of the physical fault in the test circuit. The electrical signatures from the test circuits are compared with a signal from an integrated circuit memory device to determine whether any of the physical faults in the test circuits are present in the integrated circuit memory device.

23 Claims, 23 Drawing Sheets

SYSTEM AND METHOD FOR PROVIDING TESTING AND FAILURE ANALYSIS OF INTEGRATED CIRCUIT MEMORY DEVICES

This application is a continuation of prior U.S. patent application Ser. No. 10/846,004 filed on May 14, 2004 now U.S. Pat. No. 7,216,270.

TECHNICAL FIELD OF THE INVENTION

The present invention is generally directed to manufacturing technology for embedded or standalone integrated circuits containing memory devices and, in particular, to a system and method for setup and verification of systems providing yield enhancement, infab metrology, testing and failure analysis of integrated circuits containing memory devices.

BACKGROUND OF THE INVENTION

In the manufacture of integrated circuit memory devices it is necessary to test the memory devices for the presence of physical faults (e.g., short circuits, opens or other physical or electrical faults) that may occur in memory bit cells during the manufacturing process. Much effort is made to correlate the faults to fabrication processes for yield and manufacturing improvement, driving large capital expenditures. The systems involved are complex and include many aspects of the manufacture of the device. This includes inline defect monitoring, metrology, electrical test, full functional testing with bitmapping, failure analysis and complex mappings between each of the systems. The setup and verification of these systems traditionally can take months, and incur full project and technology delays, many months of human resources, and tens of thousands of dollars in failure analysis costs.

Prior art methodologies do not provide for the rapid setup and verification of the many components necessary for a fully operational, verified, and complete system for understanding and driving improvements in the manufacture and test of the integrated circuits.

Therefore, there is a need in the art for an improved system and method for the setup of the various components for yield improvement, metrology, electrical test, full functional testing, bitmapping, and failure analysis of integrated circuits containing memory devices.

SUMMARY OF THE INVENTION

To address the deficiencies of the prior art, it is an object of the present invention to provide a system and method for providing rapid setup, verification, and coordination between the various components of manufacture, yield enhancement, metrology, electrical test, full functional testing, and deciphering of the physical device topology to electrical test bitmaps representing the memory device. The integrated circuit memory device may comprise a standalone or embedded static random access memory (SRAM) device, a dynamic random access memory (DRAM) device, a Flash memory, or other similar type of memory device.

The present invention comprises a system and method for creating and testing a plurality of test circuits that represent the circuit elements of an integrated circuit memory device. Each of the test circuits is designed to create a distinct electrical signature that represents a physical fault (and its corresponding failure mode) of one or more memory bit cells of the memory device.

For example, in one advantageous embodiment of the present invention a test circuit comprising a memory bit cell of an integrated circuit memory device is created in which a short circuit grounds a wordline of the memory bit cell. The memory bit cell with its wordline shorted to ground creates a distinct electrical signature that represents the presence of that particular physical fault in the test circuit. The subsequent detection of that particular distinct electrical signature in a non-test memory device indicates that the non-test memory device contains a memory bit cell in which a wordline is shorted to ground.

Various other types of test circuits are designed and created in which each test circuit comprises a specific type of physical fault. Electrical signatures corresponding to the various types of physical faults are then obtainable from the test circuits. These electrical signatures may then be used to detect the same physical faults in non-test memory devices.

It is an object of the present invention to provide a system and method for providing a plurality of test circuits, each of which is capable of creating a distinct electrical signature that represents a physical fault and a corresponding failure mode in a memory device.

It is also an object of the present invention to provide a system and method for reducing the time required to test memory devices compared to the time required to test memory devices using prior art testing and failure analysis methods.

It is yet another object of the present invention to provide rapid verification of failure analysis capabilities during the testing of memory devices.

It is still another object of the present invention to provide a system and method for simulating defect driven yield loss mechanisms to improve yield enhancement activities in the manufacture of memory devices.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 27, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit memory cell structures.

Figure 1:
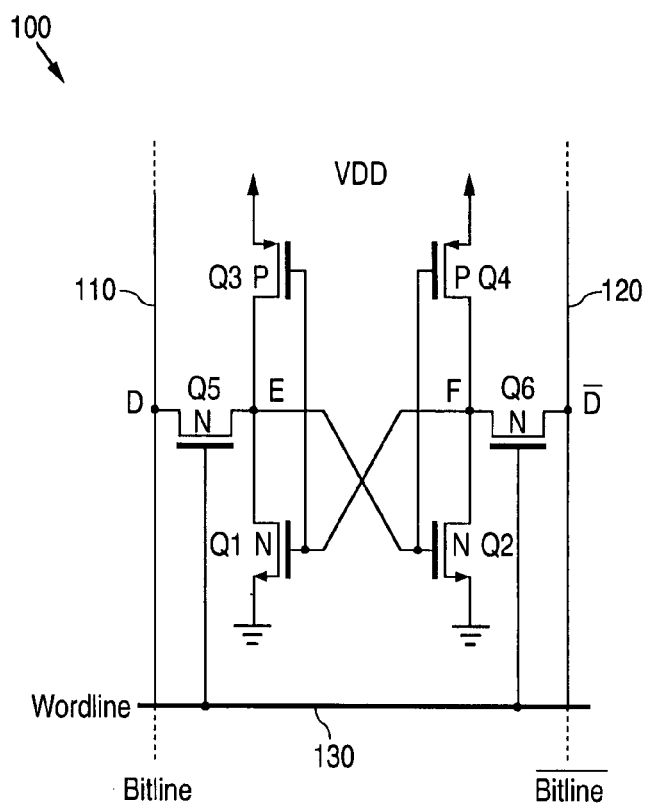
FIG. 1 illustrates a bit cell of a prior art static random access memory circuit (SRAM)

FIG. 1 illustrates an exemplary bit cell 100 of a prior art static random access memory circuit (SRAM). Bit cell 100 comprises six (6) metal oxide semiconductor field effect transistors (MOSFET). The transistors are connected together in the configuration shown in FIG. 1. Transistors Q1, Q2, Q5 and Q6 each comprise an n-channel transistor (denoted with the letter N). Transistor Q3 and Q4 each comprise a p-channel transistor (denoted with the letter P).

The source of transistor Q1 and the source of transistor Q2 are connected to ground. The source of transistor Q3 and the source of transistor Q4 are connected to the operating voltage VDD. The gate of transistor Q1 is connected to the gate of transistor Q3. The gate of transistor Q2 is connected to the gate of transistor Q4. The source of transistor Q5 is connected to a first bitline 110 at node "D". The source of transistor Q6 is connected to a second bitline 120 at node "D Bar". The gate of transistor Q5 and the gate of transistor Q6 are each connected to a wordline 130.

The drain of transistor Q1, the drain of transistor Q3, the drain of transistor Q5 and the gate of transistor Q2 are connected to node "E". The drain of transistor Q4, the drain of transistor Q2, the drain of transistor Q6, and the gate of transistor Q1 are connected to node "F".

Now consider the operation of bit cell 100 when a logical one ("1") is written to bit cell 100. First the voltage on wordline 130 is set to the operating voltage VDD. This provides a "select word" command that turns on transistor Q5 and turns on transistor Q6. Then the voltage on bitline 110 is set to the operating voltage VDD (the voltage at node D) and the voltage on bitline 120 is set to a "zero" voltage (the voltage at node D Bar). In practice, the "zero" voltage at node D Bar is approximately one half of the operating voltage VDD.

The application of these voltages turns on transistor Q2 and turns off transistor Q1. Now wordline 130 is deselected by setting the voltage on wordline 130 to the "zero" voltage level. Bit cell 100 now holds a logical one ("1").

Now consider the operation of bit cell 100 when a logical one ("1") or a logical zero ("0") is read from bit cell 100. The voltage level at node D and the voltage level at node D Bar are both set to the "zero" voltage level (i.e., one half VDD). Then the voltage on wordline 130 is set to the operating voltage level of VDD. This provides a "select word" command that turns on transistor Q5 and turns on transistor Q6. Then D and D Bar signals are fed to column sense-Amp (one per column) to determine the state of the bit (i.e., either a logical one ("1") or a logical zero ("0")) that is held by bit cell 100.

The methods described above for writing a bit into bit cell 100 and for reading a bit from bit cell 100 are well known in the art. When physical faults (e.g., short circuits) occur within the circuit elements of bit cell 100 then bit cell 100 operates in a failure mode. The operation of bit cell 100 in failure mode generates a distinct electrical signature that represents the presence of the physical fault in bit cell 100.

In the description of the present invention that follows the test circuits that will be described comprise a memory bit cell 100 of a static random access memory (SRAM) device. It will be readily understood by those skilled in the art that test circuits that comprise memory bit cells from other types of memory devices may also be used. In particular, the test circuits of the present invention may comprises memory bit cells from dynamic random access memory (DRAM) devices, Flash memory devices, and other similar types of memory devices.

Figure 2:
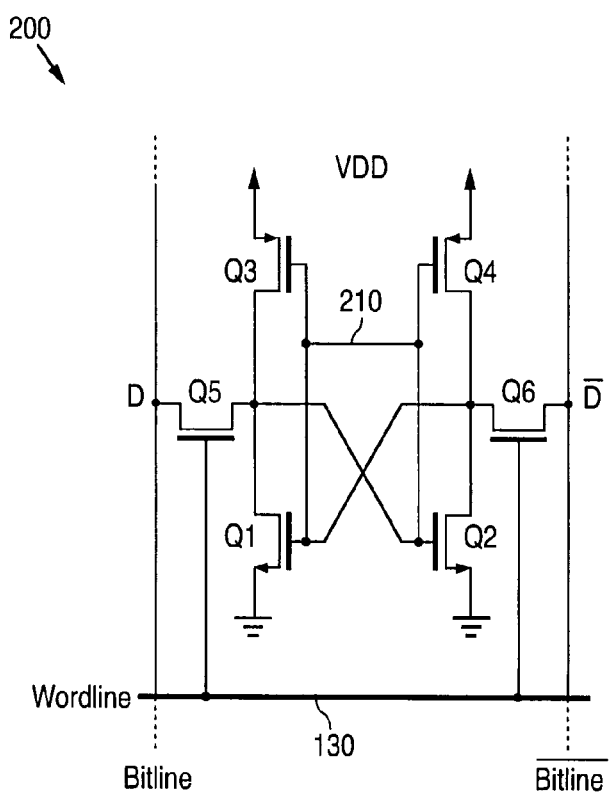
FIG. 2 illustrates a circuit that exhibits a single bit failure in the bit cell of the SRAM circuit of FIG. 1.

FIG. 2 illustrates a circuit 200 that exhibits a single bit failure in the bit cell 100 of the SRAM circuit of FIG. 1. The single bit failure is generated by a short circuit 210 that connects (1) the line that connects the gates of transistor Q1 and transistor Q3, and (2) the line that connects the gates of transistor Q2 and Q4. Circuit 200 produces a distinct electrical signature that indicates the presence of short circuit 210 in bit cell 100.

Figure 3:
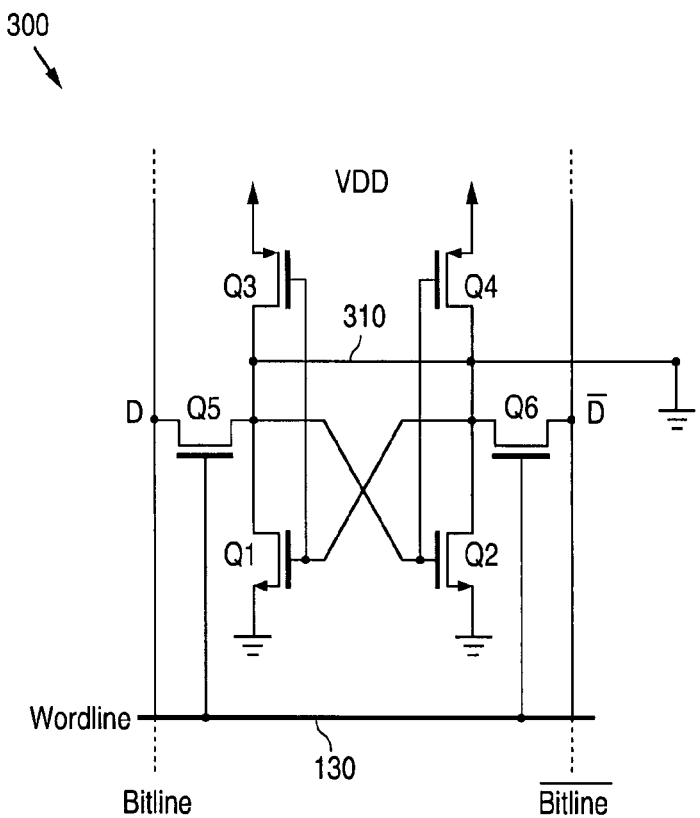
FIG. 3 illustrates a circuit that exhibits a single bit failure stuck low in the bit cell of the SRAM circuit of FIG. 1.

FIG. 3 illustrates a circuit 300 that exhibits a single bit failure stuck low in the bit cell 100 of the SRAM circuit of FIG. 1. The single bit failure stuck low is generated by a short circuit 310 that connects (1) the line that connects the drains of transistor Q1 and transistor Q3, and (2) the line that connects the drains of transistor Q2 and Q4, and (3) the ground 320. Circuit 300 produces a distinct electrical signature that indicates the presence of short circuit 310 in bit cell 100. The single bit failure stuck low continually produces a logical zero ("0") in bit cell 100.

Figure 4:
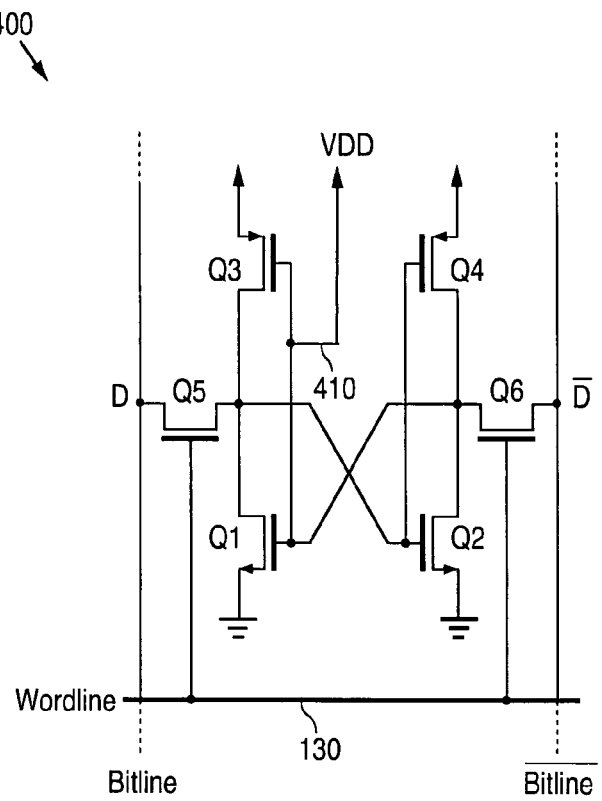
FIG. 4 illustrates a circuit that exhibits an alternate form of a single bit failure stuck low in the bit cell of the SRAM circuit of FIG. 1.

FIG. 4 illustrates a circuit 400 that exhibits an alternate form of a single bit failure stuck low in the bit cell 100 of the SRAM circuit of FIG. 1. In this embodiment the single bit failure stuck low is generated by a short circuit 410 that connects the line that connects the gates of transistor Q1 and transistor Q3 to the operating voltage level VDD. Circuit 400 produces a distinct electrical signature that indicates the presence of the short circuit 410 in bit cell 100. The single bit failure stuck low continually produces a logical zero ("0") in bit cell 100.

Figure 5:
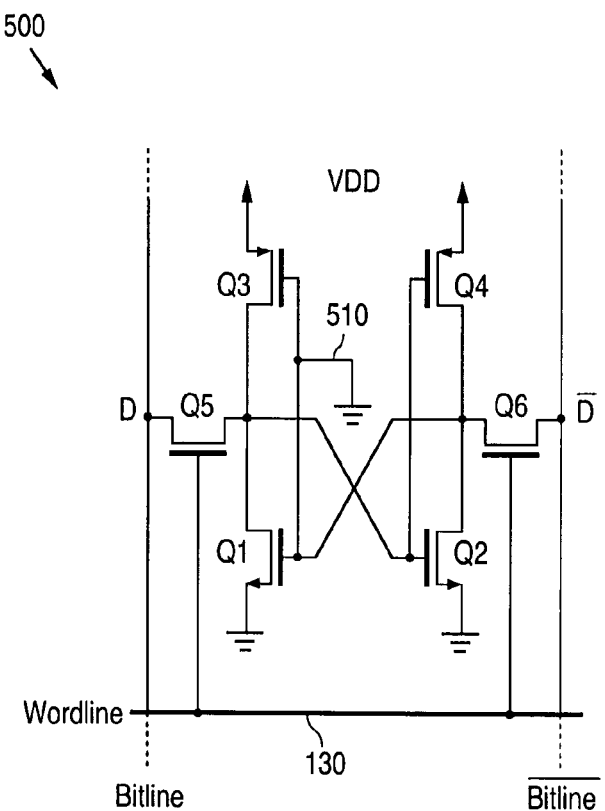
FIG. 5 illustrates a circuit that exhibits a single bit failure stuck high in the bit cell of the SRAM circuit of FIG. 1.

FIG. 5 illustrates a circuit 500 that exhibits a single bit failure stuck high in the bit cell of the SRAM circuit of FIG. 1. The single bit failure stuck high is generated by a short circuit 510 that grounds the line that connects the gates of transistor Q1 and transistor Q3. Circuit 500 produces a distinct electrical signature that indicates the presence of short circuit 510 in bit cell 100. The single bit failure stuck high continually produces a logical one ("1") in bit cell 100.

Figure 6:
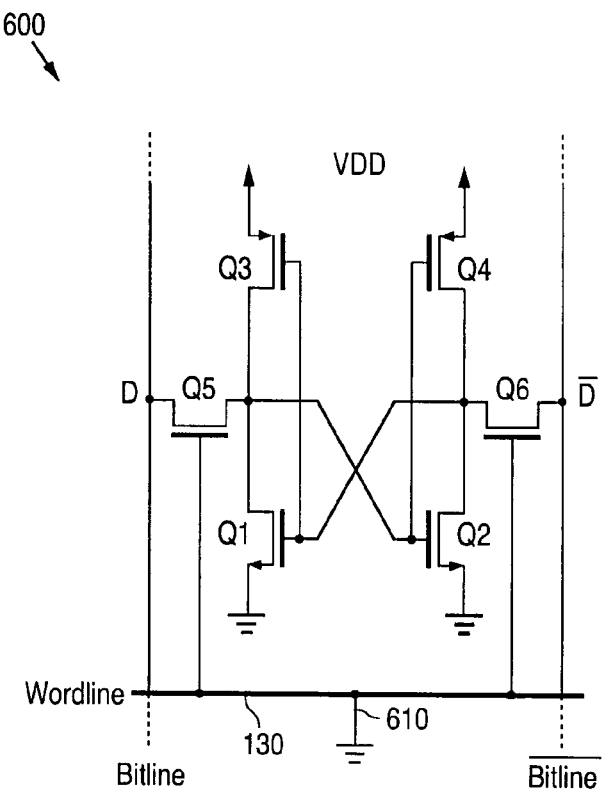
FIG. 6 illustrates a circuit that exhibits a full row (wordline) low failure in the bit cell of the SRAM circuit of FIG. 1.

FIG. 6 illustrates a circuit 600 that exhibits a full row (wordline) low failure in the bit cell 100 of the SRAM circuit of FIG. 1. The full row (wordline) low failure is generated by a short circuit 610 that grounds wordline 130. Circuit 600 produces a distinct electrical signature that indicates the presence of short circuit 610 in bit cell 100. The full row (wordline) low failure continually produces a logical zero ("0") on wordline 130.

Figure 7:
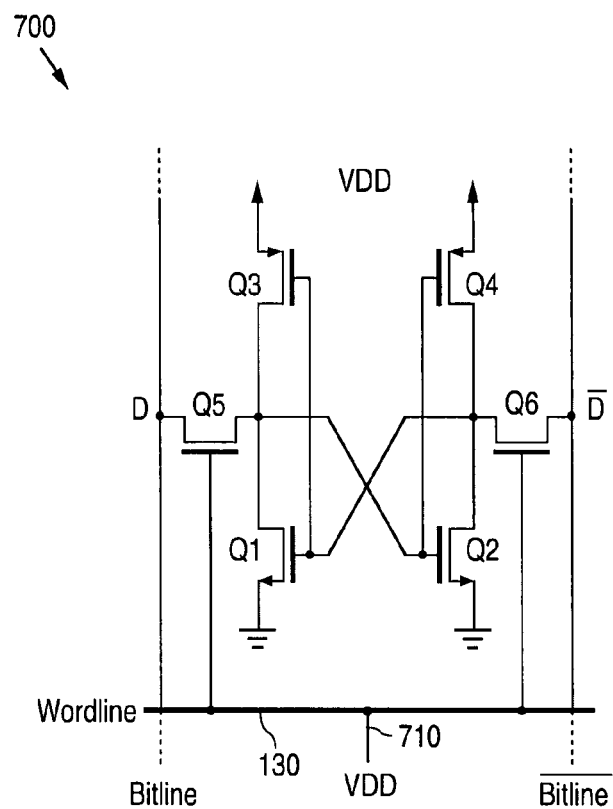
FIG. 7 illustrates a circuit that exhibits a full row (wordline) high failure in the bit cell of the SRAM circuit of FIG. 1.

FIG. 7 illustrates a circuit 700 that exhibits a full row (wordline) high failure in the bit cell 100 of the SRAM circuit of FIG. 1. The full row (wordline) high failure is generated by a short circuit 710 that connects wordline 130 to the operating voltage VDD. Circuit 700 produces a distinct electrical signature that indicates the presence of short circuit 710 in bit cell 100. The full row (wordline) high failure continually produces a logical one ("1") on wordline 130.

Figure 8:
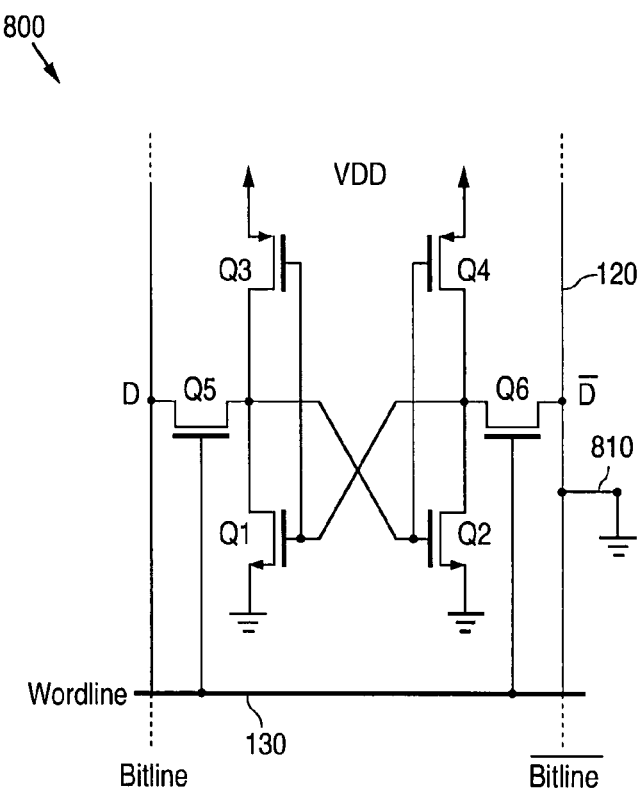
FIG. 8 illustrates a circuit that exhibits a full column (bitline) low failure in the bit cell of the SRAM circuit of FIG. 1.

FIG. 8 illustrates a circuit 800 that exhibits a full column (bitline) low failure in the bit cell 100 of the SPAM circuit of FIG. 1. The full column (bitline) low failure is generated by a short circuit 810 that grounds bitline 120. Circuit 800 produces a distinct electrical signature that indicates the presence of short circuit 810 in bit cell 100. The full column (bitline) low failure continually produces a logical zero ("0") on bitline 120.

Figure 9:
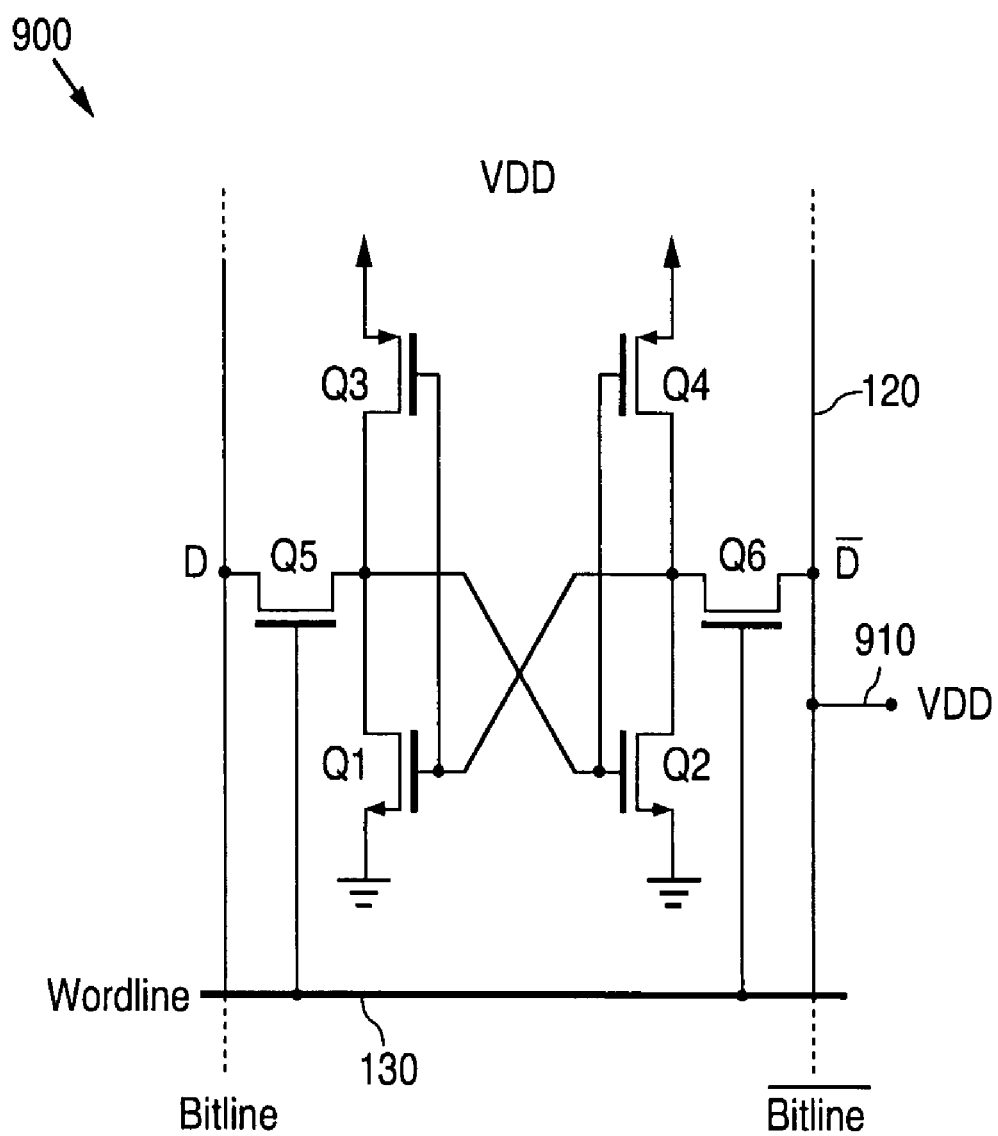
FIG. 9 illustrates a circuit that exhibits a full column (bitline) high failure in the bit cell of the SRAM circuit of FIG. 1.

FIG. 9 illustrates a circuit 900 that exhibits a full column (bitline) high failure in the bit cell 100 of the SRAM circuit of FIG. 1. The full column (bitline) high failure is generated by a short circuit 910 that connects bitline 120 to the operating voltage VDD. Circuit 900 produces a distinct electrical signature that indicates the presence of short circuit 910 in bit cell 100. The full column (bitline) high failure continually produces a logical one ("1") on bitline 120.

Figure 10:
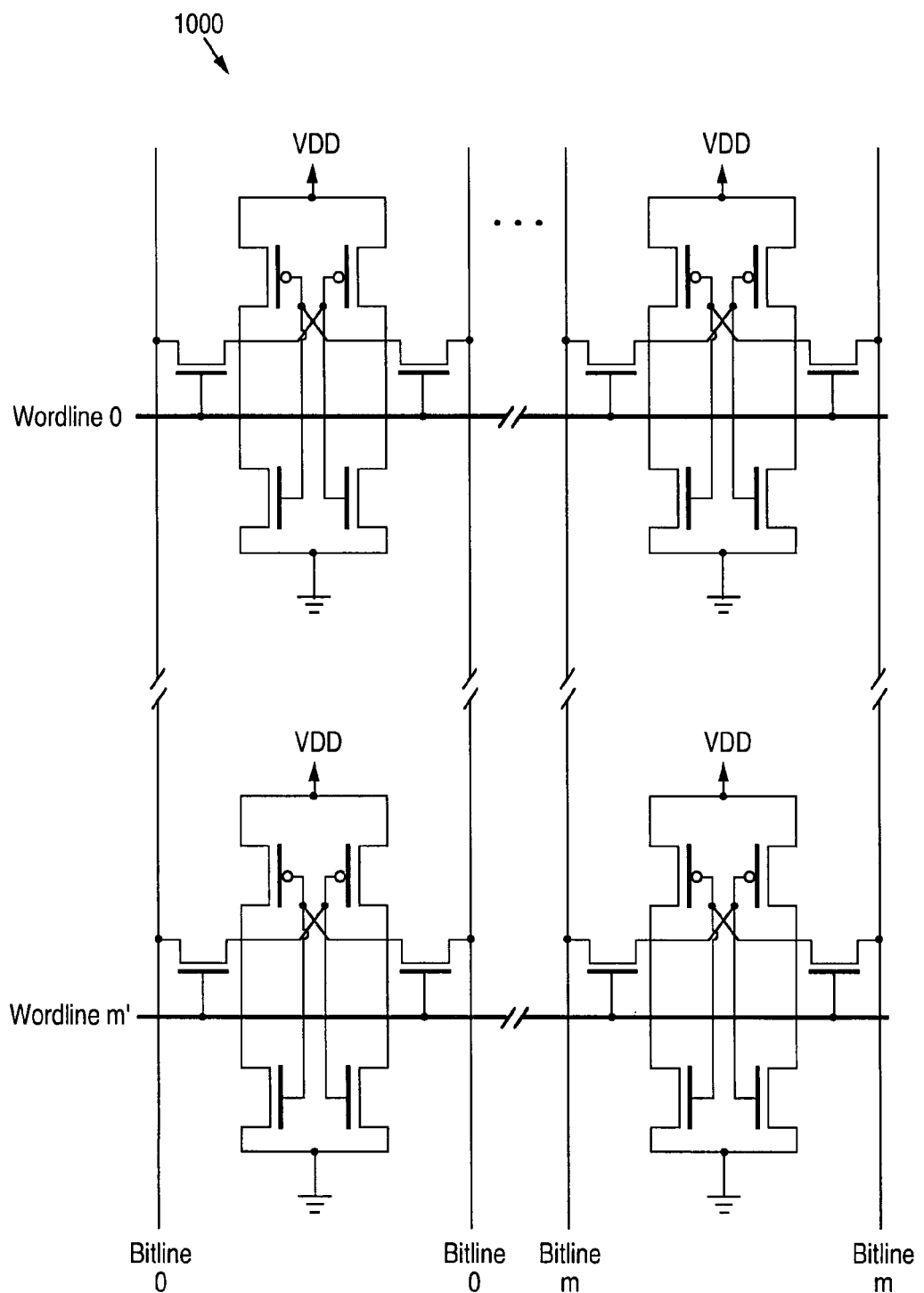
FIG. 10 illustrates a memory array of bit cells of a prior art static random access memory circuit (SRAM)

FIG. 10 illustrates a memory array 1000 of bit cells of a prior art static random access memory circuit (SRAM). Memory array 1000 comprises "m+1" pairs of bitlines (designated bitline pair 0 through bitline pair m). Memory array 1000 also comprises "m'+1" wordlines (designated wordline 0 through wordline m') Therefore memory array 1000 comprises ("m+1" times "m'+1") bit cells coupled together as shown in FIG. 10. Each bit cell in memory array 1000 has the same structure as bit cell 100 of FIG. 1. In FIG. 10 the leftmost bitline in each bit pair corresponds to bitline 110 of bit cell 100 and the rightmost bitline in each bit pair corresponds to bitline 120 of bit cell 100.

Figure 11:
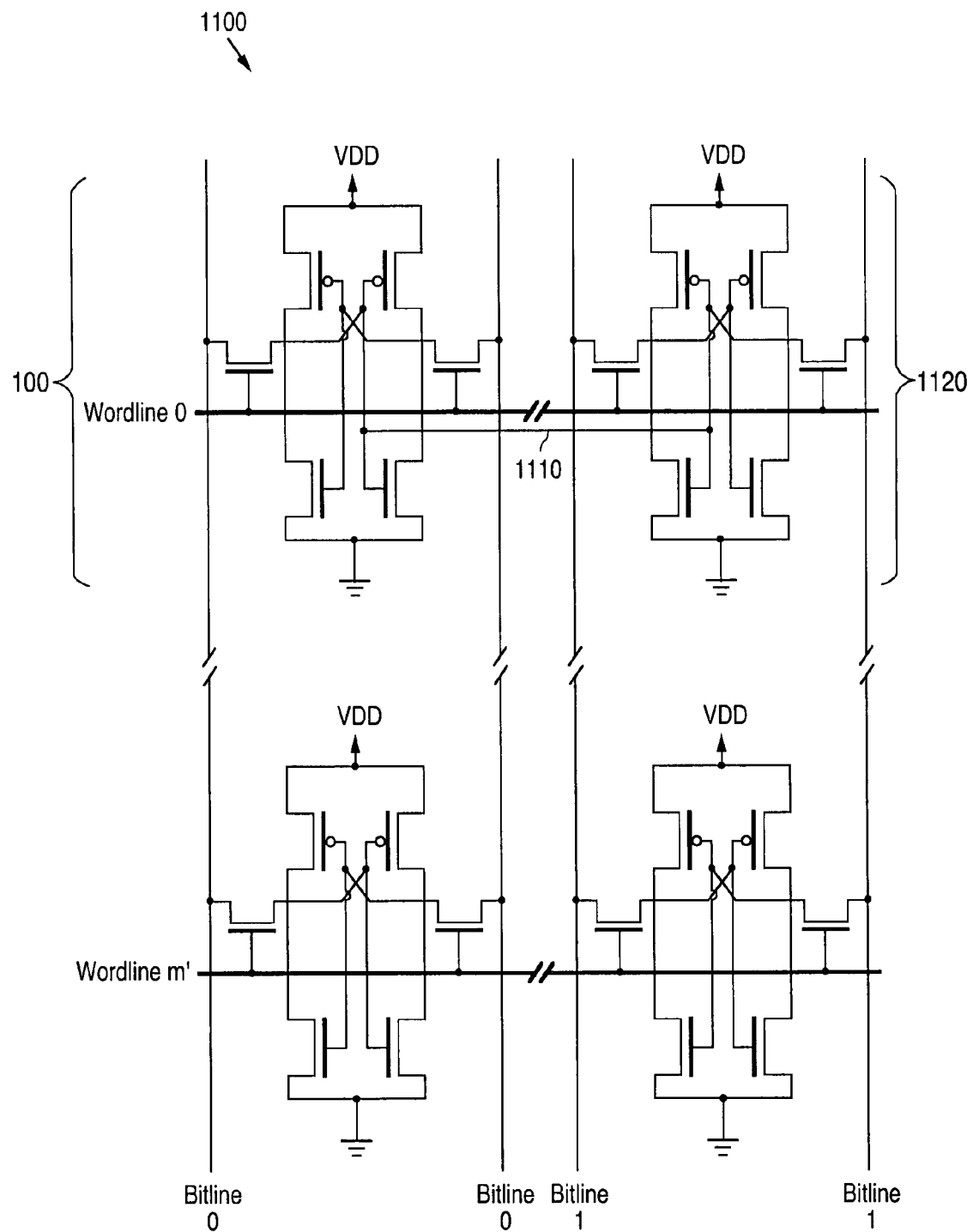
FIG. 11 illustrates a circuit that exhibits a row pair bit failure (neighboring bits) in the memory array of bit cells of the SRAM circuit of FIG. 10.

FIG. 11 illustrates a circuit 1100 that exhibits a row pair bit failure (neighboring bits) in the memory array 1000 of bit cells of the SRAM circuit of FIG. 10. The row pair bit failure (neighboring bits) is generated by a short circuit 1110 that connects (1) the line that connects the gates of transistor Q2 and transistor Q4 of bit cell 100 with (2) the line that connects the gates of transistor Q1 and transistor Q3 of the neighboring bit cell 1120. In this example bit cell 100 and bit cell 1120 are located on the same wordline (wordline 0). In this example bit cell 100 and bit cell 1120 are also located on adjacent pairs of bitlines (bitline pair 0 and bitline pair 1). Circuit 1100 produces a distinct electrical signature that indicates the presence of short circuit 1110 between bit cell 100 and bit cell 1120.

Figure 12:
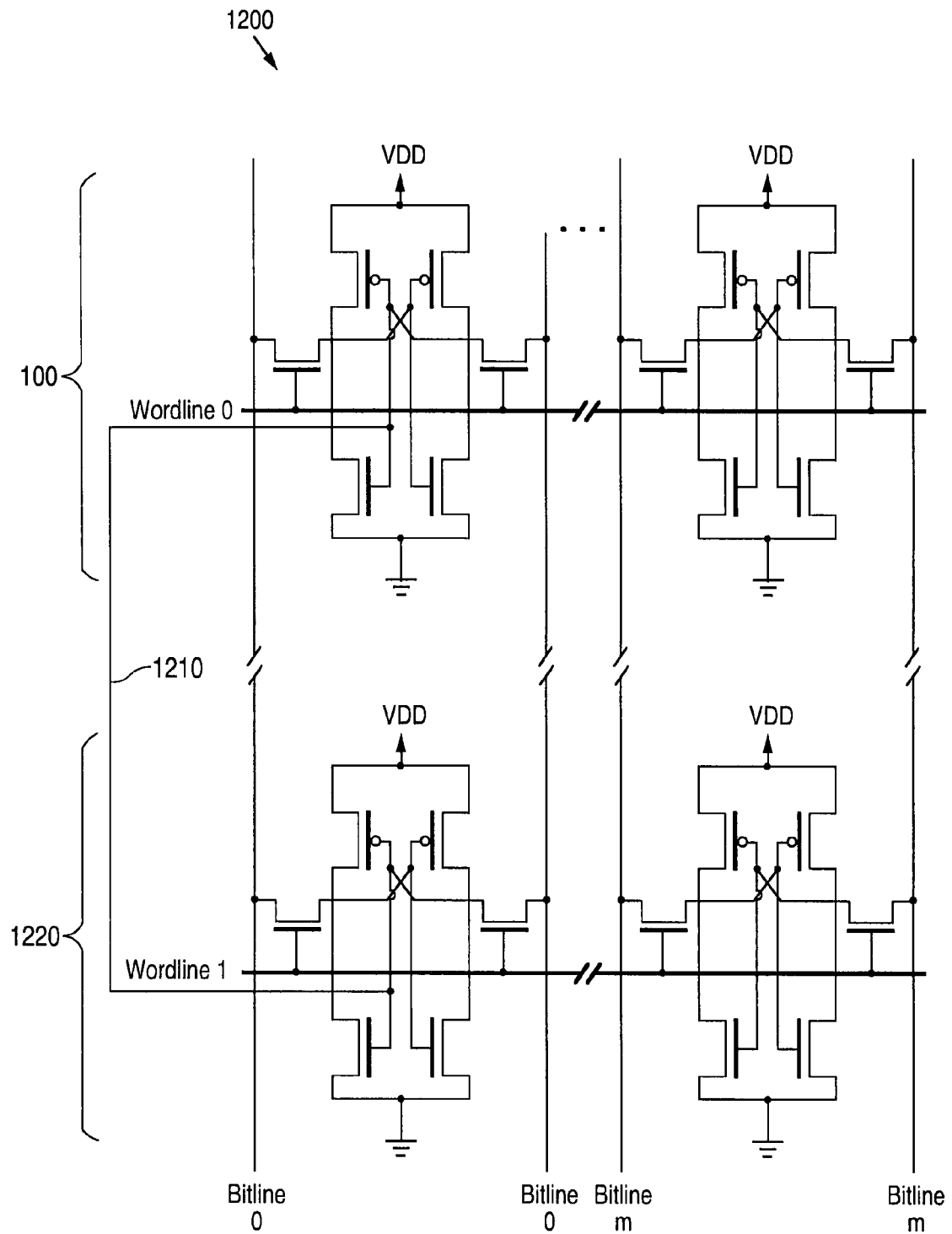
FIG. 12 illustrates a circuit that exhibits a column pair bit failure (neighboring bits) in the memory array of bit cells of the SRAM circuit of FIG. 10.

FIG. 12 illustrates a circuit 1200 that exhibits a column pair bit failure (neighboring bits) in the memory array 1000 of bit cells of the SRAM circuit of FIG. 10. The column pair bit failure (neighboring bits) is generated by a short circuit 1210 that connects (1) the line that connects the gates of transistor Q1 and transistor Q3 of bit cell 100 with (2) the line that connects the gates of transistor Q1 and transistor Q3 of the neighboring bit cell 1220. In this example bit cell 100 and bit cell 1220 are located on the same bitline pair (bitline pair 0). In this example bit cell 100 and bit cell 1220 are also located on adjacent wordlines (wordline 0 and wordline 1). Circuit 1200 produces a distinct electrical signature that indicates the presence of short circuit 1210 between bit cell 100 and bit cell 1220.

Figure 13:
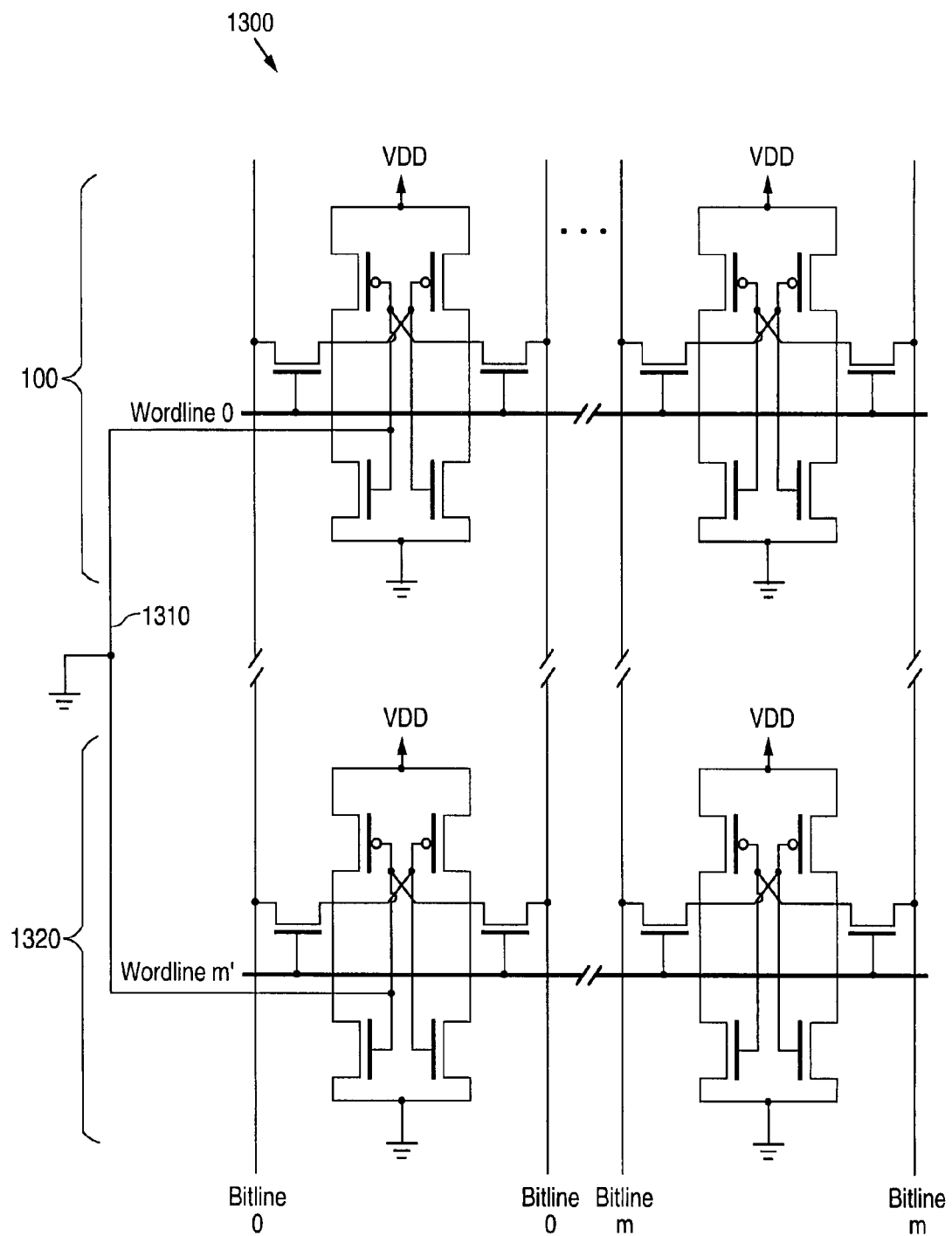
FIG. 13 illustrates a circuit that exhibits a column pair bit failure stuck high in the memory array of bit cells of the SRAM circuit of FIG. 10.

FIG. 13 illustrates a circuit 1300 that exhibits a column pair bit failure stuck high in the memory array 1000 of bit cells of the SRAM circuit of FIG. 10. The column pair bit failure stuck high is generated by a short circuit 1310 that grounds (1) the line that connects the gates of transistor Q1 and transistor Q3 of bit cell 100 with (2) the line that connects the gates of transistor Q1 and transistor Q3 of another column bit cell 1320. In this example bit cell 100 and bit cell 1320 are located on the same bitline pair (bitline pair 0). In this example bit cell 100 and bit cell 1320 are also located on different wordlines (wordline 0 and wordline m'). Circuit 1300 produces a distinct electrical signature that indicates the presence of short circuit 1310 between bit cell 100 and bit cell 1320.

Figure 14:
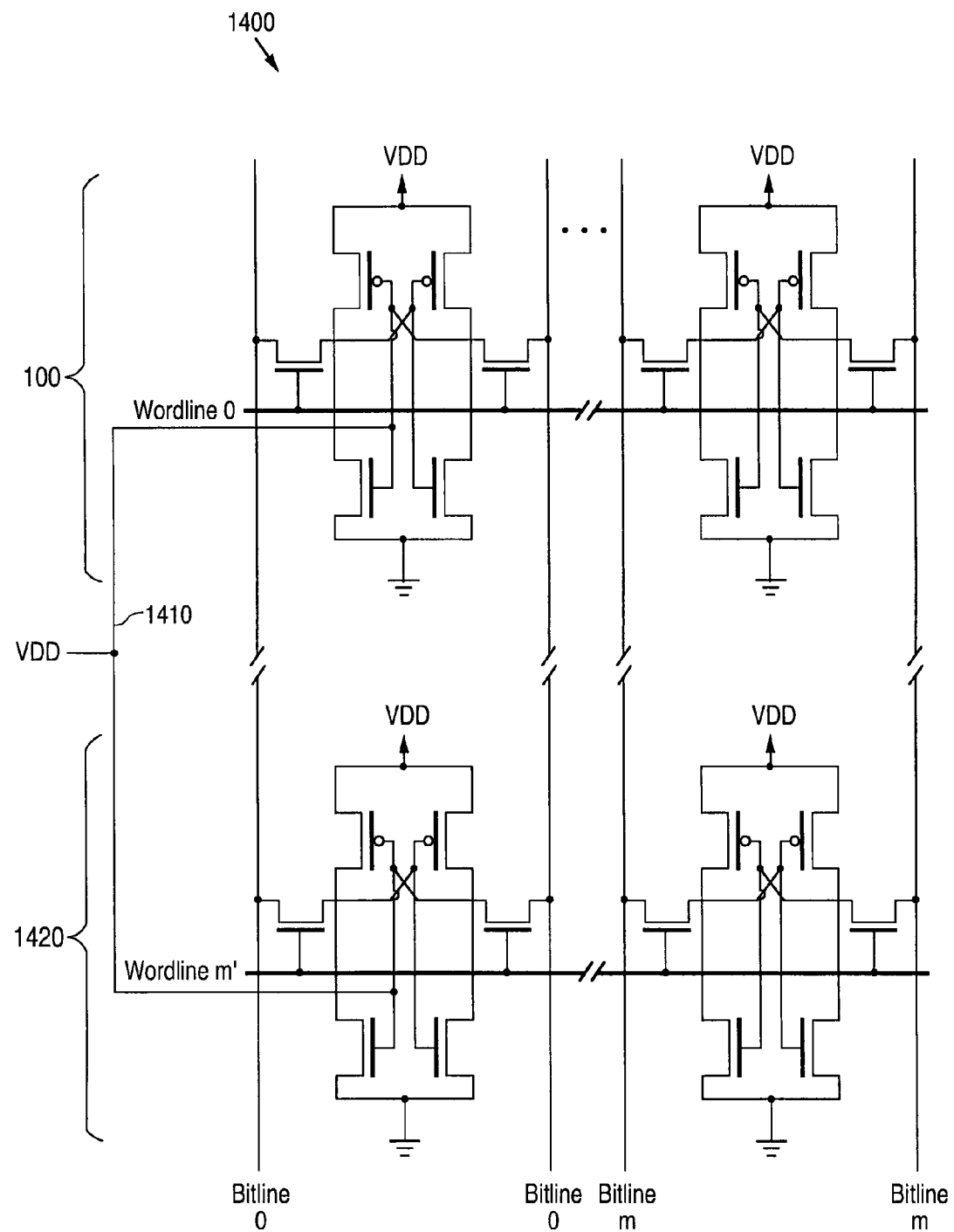
FIG. 14 illustrates a circuit that exhibits a column pair bit failure stuck low in the memory array of bit cells of the SRAM circuit of FIG. 10.

FIG. 14 illustrates a circuit 1400 that exhibits a column pair bit failure stuck low in the memory array of bit cells of the SRAM circuit of FIG. 10. The column pair bit failure stuck low is generated by a short circuit 1410 that connects (1) the line that connects the gates of transistor Q1 and transistor Q3 of bit cell 100 and (2) the line that connects the gates of transistor Q1 and transistor Q3 of another column bit cell 1420 with the operating voltage VDD. In this example bit cell 100 and bit cell 1420 are located on the same bitline pair (bitline pair 0). In this example bit cell 100 and bit cell 1420 are also located on different wordlines (wordline 0 and wordline m'). Circuit 1400 produces a distinct electrical signature that indicates the presence of short circuit 1410 between bit cell 100 and bit cell 1420.

Figure 15:
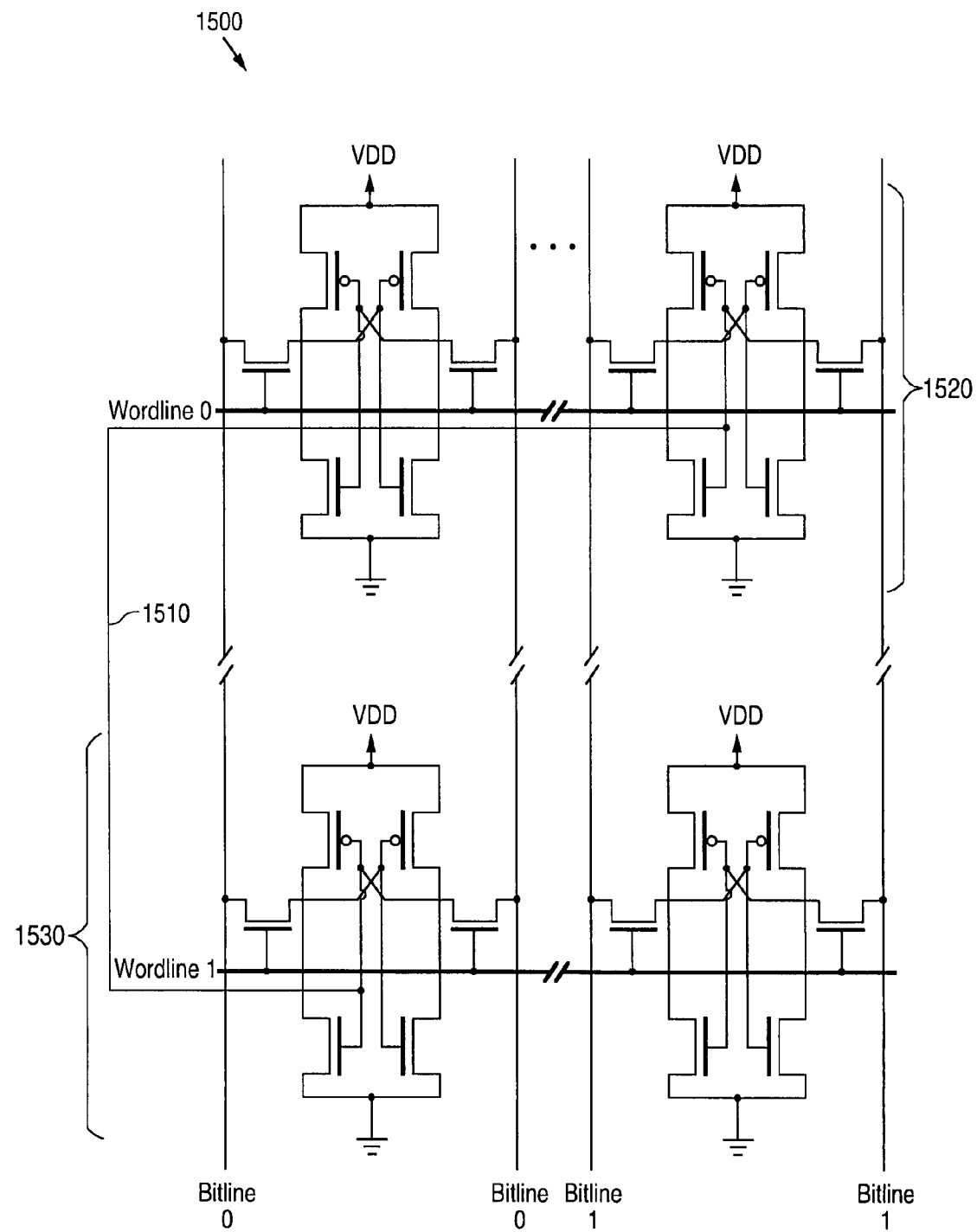
FIG. 15 illustrates a circuit that exhibits a diagonal pair bit failure (neighboring bits) in the memory array of bit cells of the SRAM circuit of FIG. 10.

FIG. 15 illustrates a circuit 1500 that exhibits a diagonal pair bit failure (neighboring bits) in the memory array 1000 of bit cells of the SRAM circuit of FIG. 10. The diagonal pair bit failure (neighboring bits) is generated by a short circuit 1510 that connects (1) the line that connects the gates of transistor Q1 and transistor Q3 of bit cell 1520 and (2) the line that connects the gates of transistor Q1 and transistor Q3 of diagonally neighboring column bit cell 1530. In this example bit cell 1520 and bit cell 1530 are located on adjacent bitline pairs Bit cell 1520 is located on bitline pair 1. Bit cell 1530 is located on bitline pair 0. In this example bit cell 1520 and bit cell 1530 are also located on adjacent wordlines. Bit cell 1520 is located on wordline 0. Bit cell 1530 is located on wordline 1. That is, bit cell 1520 and bit cell 1530 are diagonally neighboring bit cells. Circuit 1500 produces a distinct electrical signature that indicates the presence of short circuit 1510 between bit cell 1520 and bit cell 1530.

Figure 16:
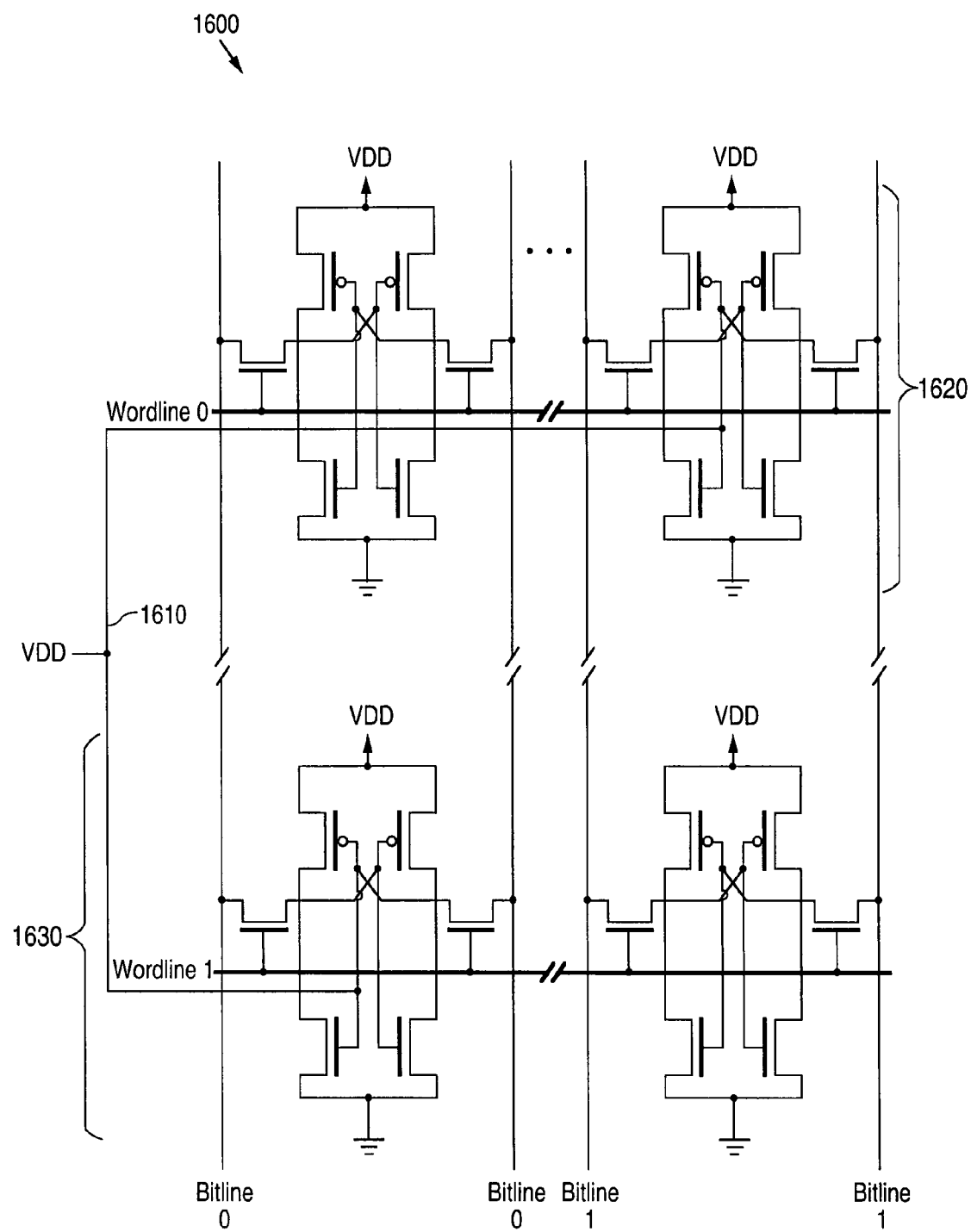
FIG. 16 illustrates a circuit that exhibits a diagonal pair bit failure (neighboring bits) stuck high in the memory array of bit cells of the SRAM circuit of FIG. 10.

FIG. 16 illustrates a circuit 1600 that exhibits a diagonal pair bit failure (neighboring bits) stuck high in the memory array 1000 of bit cells of the SRAM circuit of FIG. 10. The diagonal pair bit failure (neighboring bits) stuck high is generated by a short circuit 1610 that connects (1) the line that connects the gates of transistor Q1 and transistor Q3 of bit cell 1620 and (2) the line that connects the gates of transistor Q1 and transistor Q3 of diagonally neighboring column bit cell 1630 with the operating voltage VDD. In this example bit cell 1620 and bit cell 1630 are located on adjacent bitline pairs. Bit cell 1620 is located on bitline pair 1. Bit cell 1630 is located on bitline pair 0. In this example bit cell 1620 and bit cell 1630 are also located on adjacent wordlines. Bit cell 1620 is located on wordline 0. Bit cell 1630 is located on wordline 1. That is, bit cell 1620 and bit cell 1630 are diagonally neighboring bit cells. Circuit 1600 produces a distinct electrical signature that indicates the presence of short circuit 1610 between bit cell 1620 and bit cell 1630.

Figure 17:
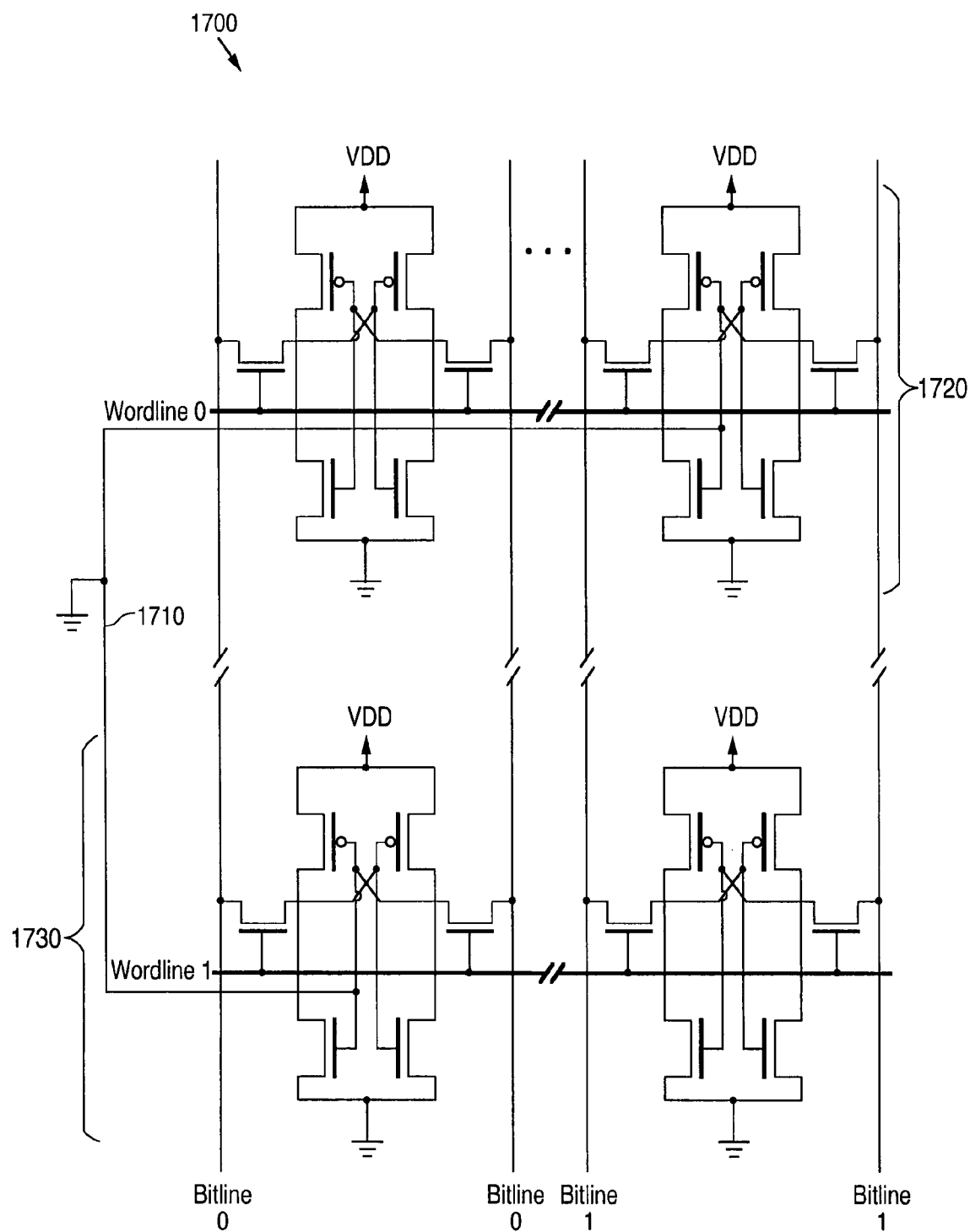
FIG. 17 illustrates a circuit that exhibits a diagonal pair bit failure (neighboring bits) stuck low in the memory array of bit cells of the SRAM circuit of FIG. 10.

FIG. 17 illustrates a circuit 1700 that exhibits a diagonal pair bit failure (neighboring bits) stuck low in the memory array 1000 of bit cells of the SRAM circuit of FIG. 10. The diagonal pair bit failure (neighboring bits) stuck low is generated by a short circuit 1710 that grounds (1) the line that connects the gates of transistor Q1 and transistor Q3 of bit cell 1720 and (2) the line that connects the gates of transistor Q1 and transistor Q3 of diagonally neighboring column bit cell 1730. In this example bit cell 1720 and bit cell 1730 are located on adjacent bitline pairs. Bit cell 1720 is located on bitline pair 1. Bit cell 1730 is located on bitline pair 0. In this example bit cell 1720 and bit cell 1730 are also located on adjacent wordlines. Bit cell 1720 is located on wordline 0. Bit cell 1730 is located on wordline 1. That is, bit cell 1720 and bit cell 1730 are diagonally neighboring bit cells. Circuit 1700 produces a distinct electrical signature that indicates the presence of short circuit 1710 between bit cell 1720 and bit cell 1730.

Figure 18:
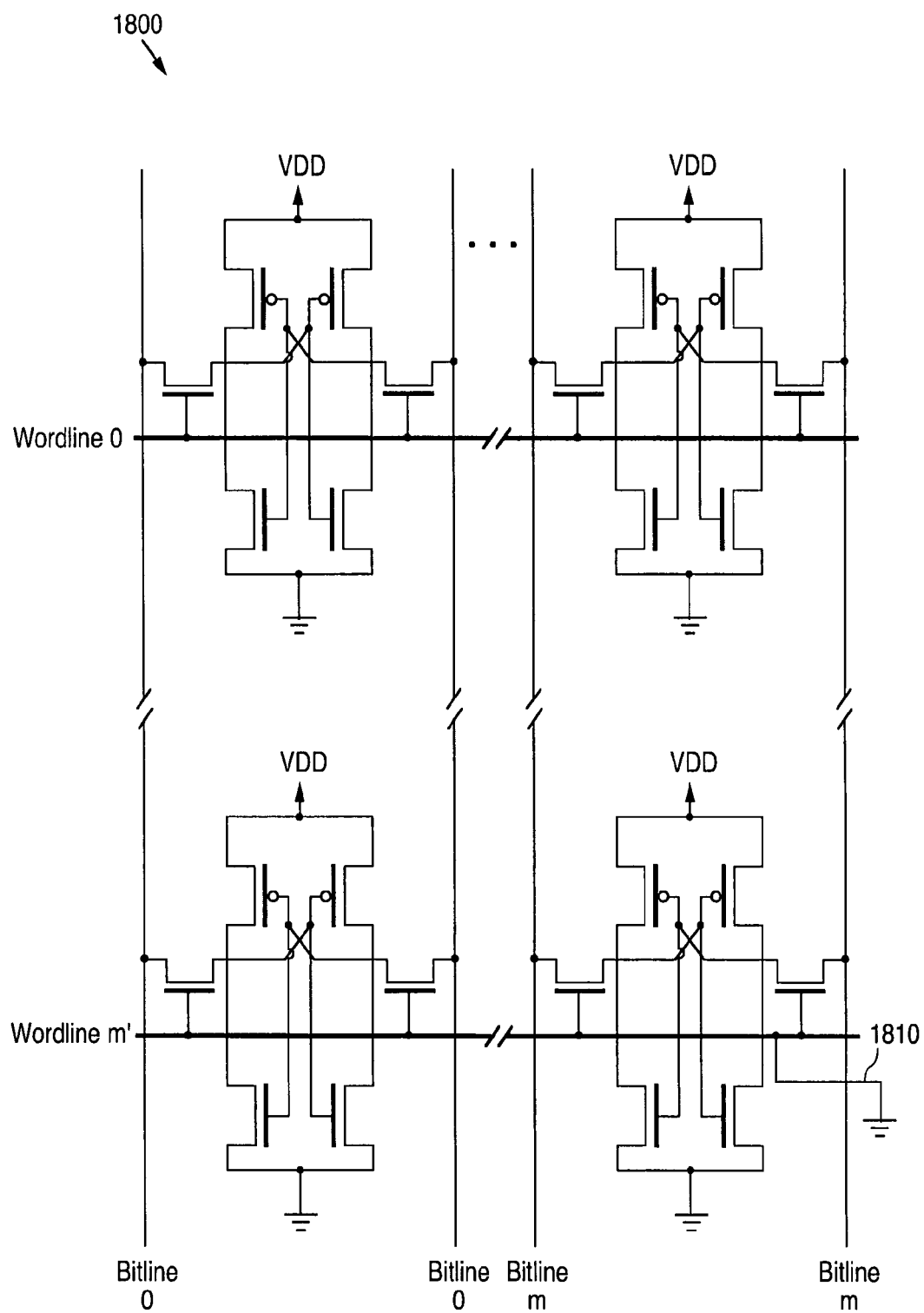
FIG. 18 illustrates a circuit that exhibits a full row fail wordline stuck low in the memory array of bit cells of the SRAM circuit of FIG. 10.

FIG. 18 illustrates a circuit 1800 that exhibits a full row fail wordline stuck low in the memory array 1000 of bit cells of the SRAM circuit of FIG. 10. The full row fail word line stuck low is generated by a short circuit 1810 that grounds one of the wordlines in memory array 1000. In the example shown in FIG. 18 the wordline m'is grounded by short circuit 1810. Circuit 1800 produces a distinct electrical signature that indicates the presence of short circuit 1810 that grounds wordline m'. The full row fail word line stuck low continually produces a logical zero ("0") on wordline m'.

Figure 19:
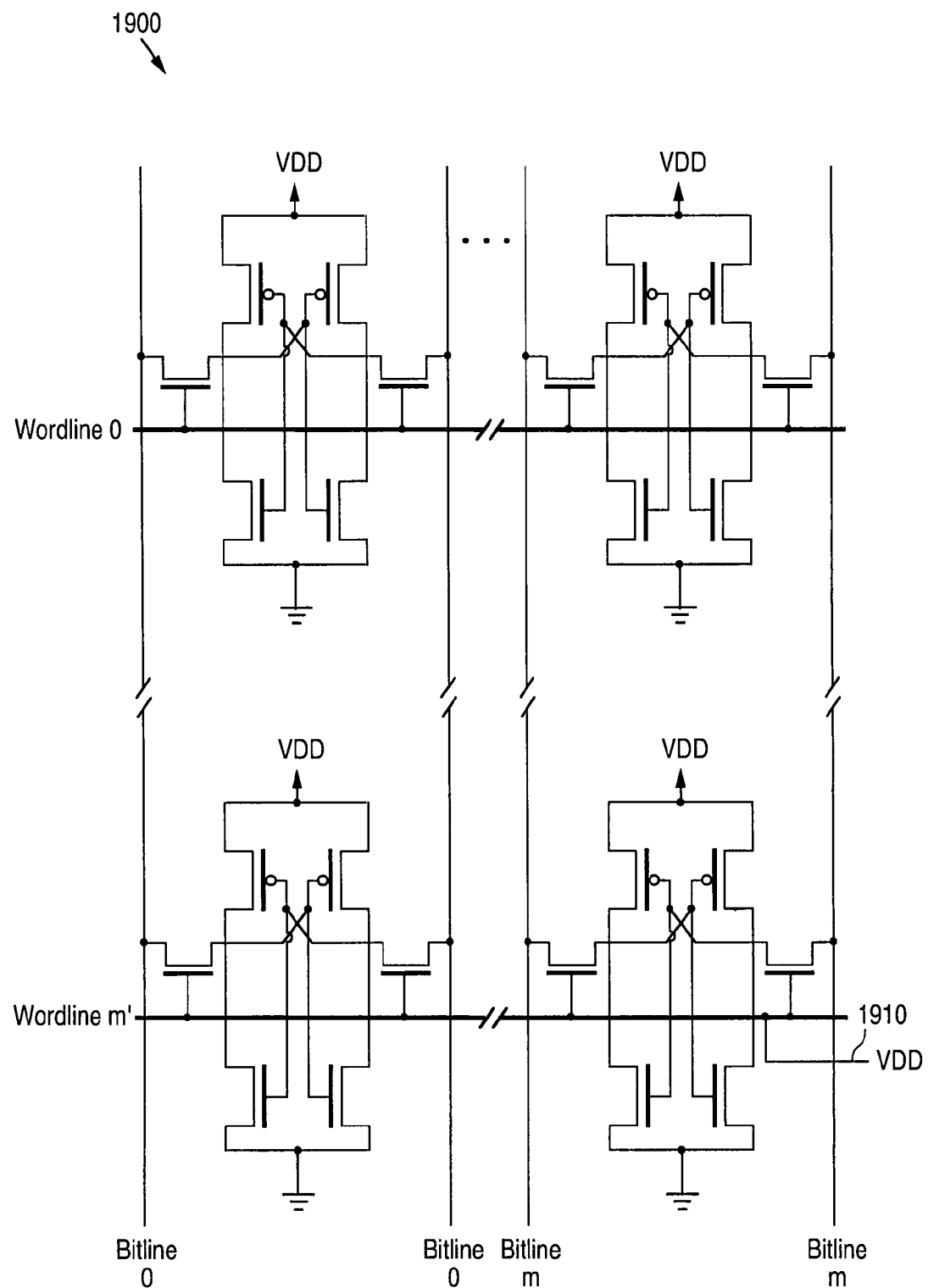
FIG. 19 illustrates a circuit that exhibits a full row fail wordline stuck high in the memory array of bit cells of the SRAM circuit of FIG. 10.

FIG. 19 illustrates a circuit 1900 that exhibits a full row fail wordline stuck high in the memory array 1000 of bit cells of the SRAM circuit of FIG. 10. The full row fail word line stuck high is generated by a short circuit 1910 that connects one of the wordlines in memory array 1000 to the operating voltage VDD. In the example shown in FIG. 19 the wordline m'is connected to the operating voltage VDD by short circuit 1910. Circuit 1900 produces a distinct electrical signature that indicates the presence of short circuit 1910 that connects wordline m' to the operating voltage VDD. The full row fail word line stuck high continually produces a logical one ("1") on wordline m'.

Figure 20:
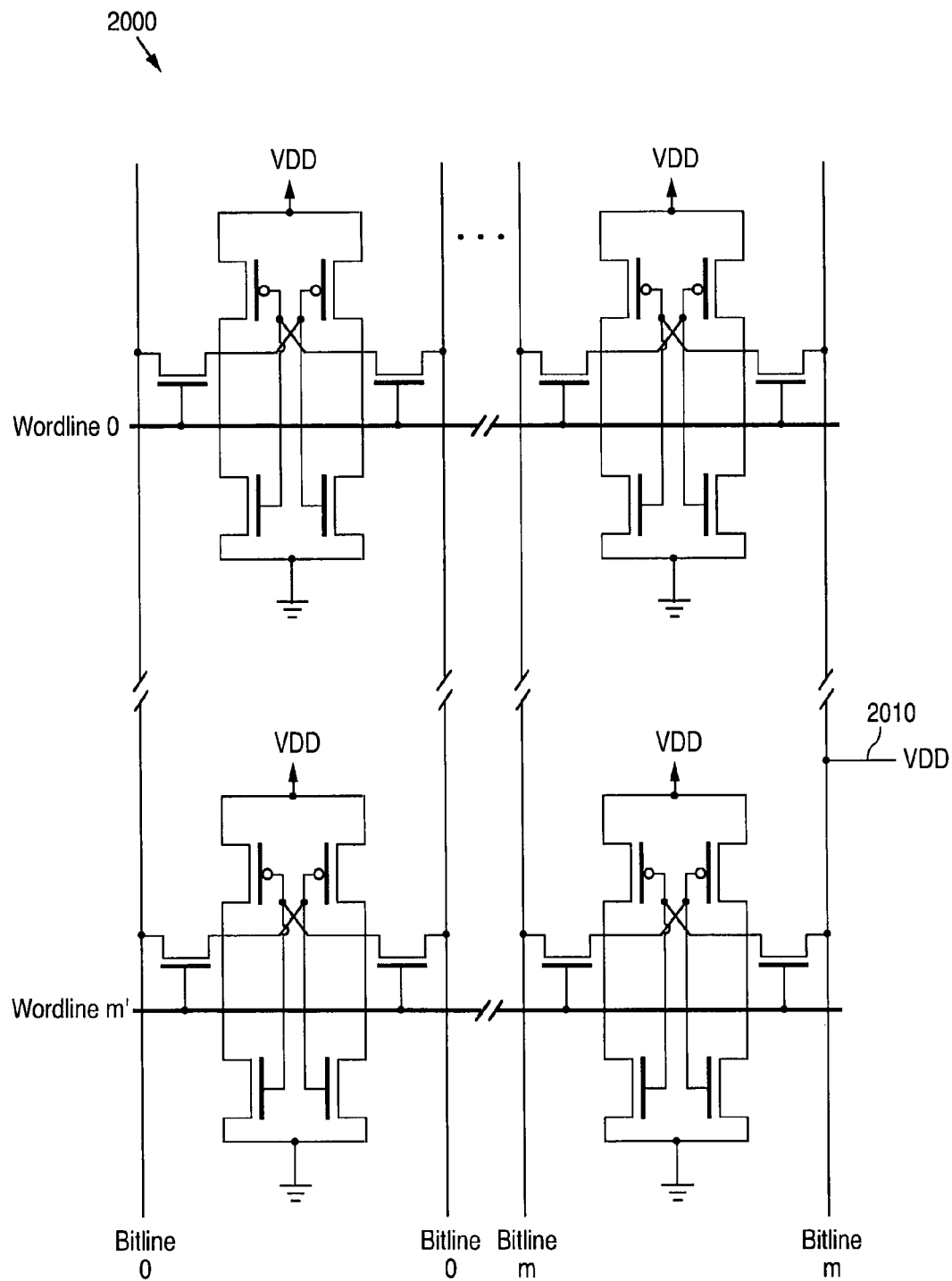
FIG. 20 illustrates a circuit that exhibits a full column fail bitline stuck high in the memory array of bit cells of the SRAM circuit of FIG. 10.

FIG. 20 illustrates a circuit 2000 that exhibits a full column fail bitline stuck high in the memory array 1000 of bit cells of the SRAM circuit of FIG. 10. The full column fail bitline stuck high is generated by a short circuit 2010 that connects one of the bitlines in a bitline pair in memory array 1000 to the operating voltage VDD. In the example shown in FIG. 20 the rightmost bitline of bitline pair "m" is connected to the operating voltage VDD by short circuit 2010. Circuit 2000 produces a distinct electrical signature that indicates the presence of short circuit 2010 that connects the rightmost bitline of bitline pair "m" to the operating voltage VDD. The full column bitline stuck high continually produces a logical one ("1") on the rightmost bitline of bitline pair "m".

Figure 21:
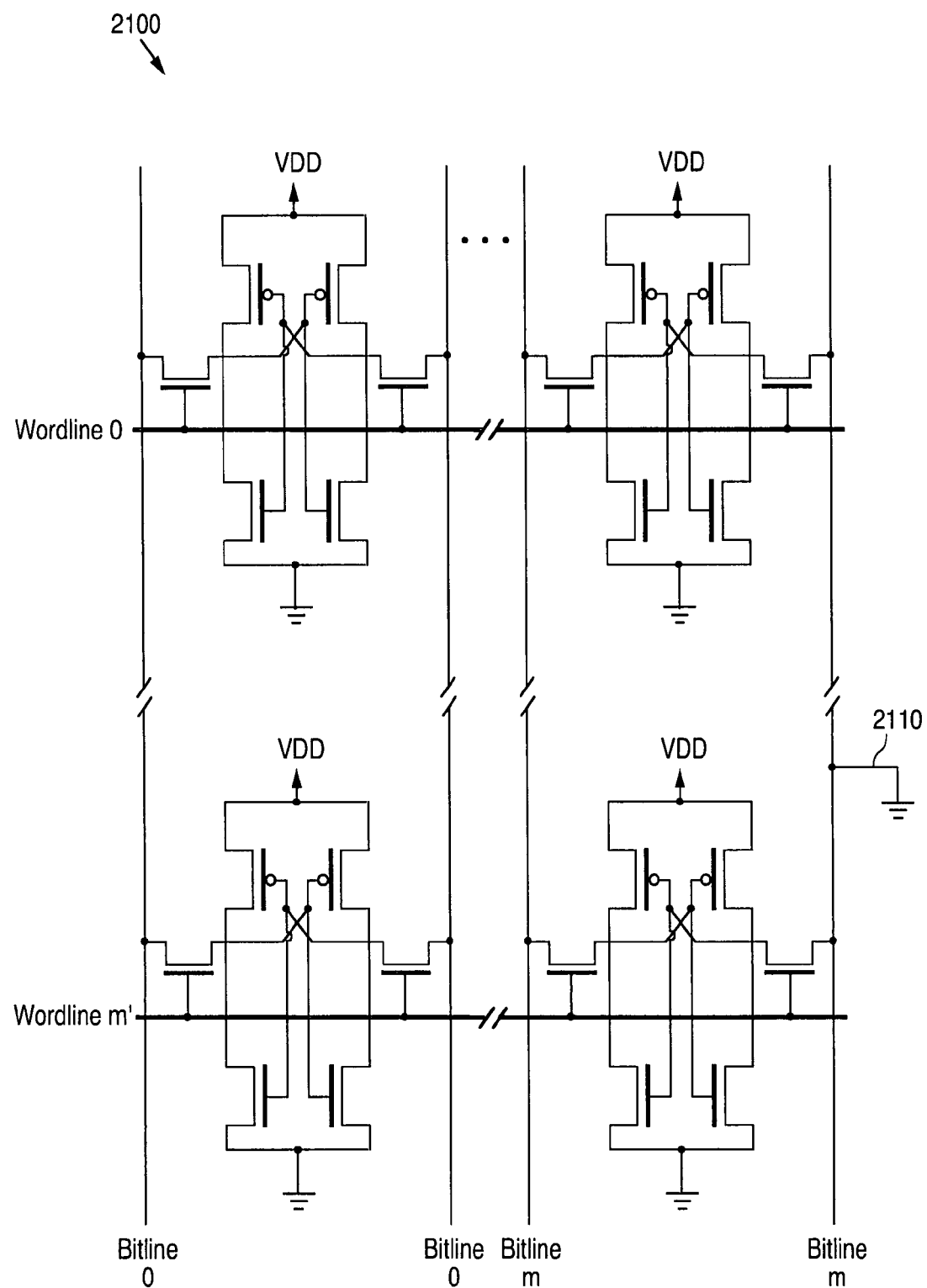
FIG. 21 illustrates a circuit that exhibits a full column fail bitline stuck low in the memory array of bit cells of the SRAM circuit of FIG. 10.

FIG. 21 illustrates a circuit 2100 that exhibits a full column fail bitline stuck low in the memory array 1000 of bit cells of the SRAM circuit of FIG. 10. The full column fail bitline stuck low is generated by a short circuit 2110 that grounds one of the bitlines in a bitline pair in memory array 1000. In the example shown in FIG. 21 the rightmost bitline of bitline pair "m" is grounded by short circuit 2110. Circuit 2100 produces a distinct electrical signature that indicates the presence of short circuit 2210 that grounds the rightmost bitline of bitline pair "m". The full column bitline stuck low continually produces a logical zero ("0") on the rightmost bitline of bitline pair "m".

Figure 22:
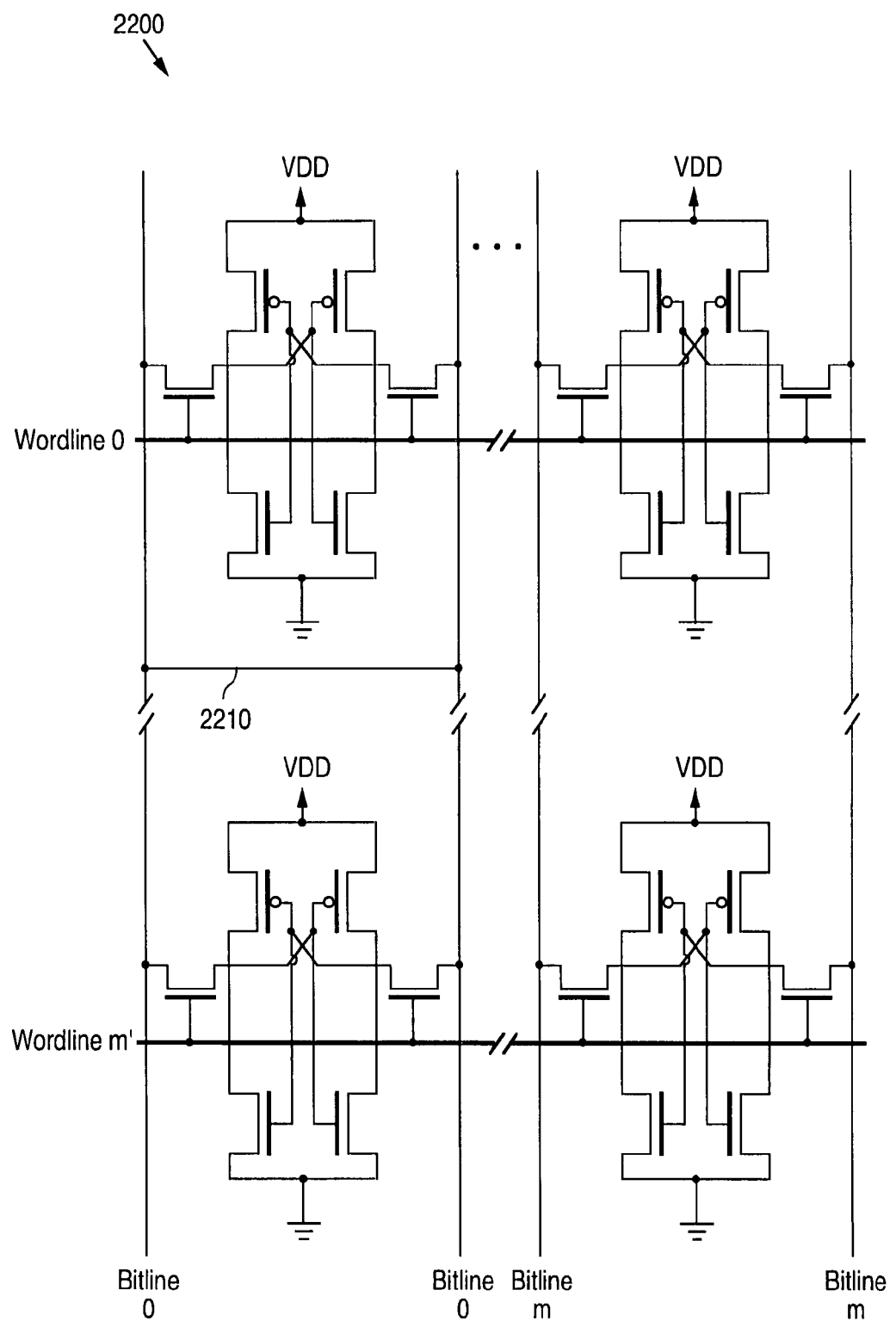
FIG. 22 illustrates a circuit that exhibits a full column fail in the memory array of bit cells of the SRAM circuit of FIG. 10.

FIG. 22 illustrates a circuit 2200 that exhibits a full column fail in the memory array 1000 of bit cells of the SRAM circuit of FIG. 10. The full column fail is generated by a short circuit 2210 that connects the two bitlines in a bitline pair in memory array 1000. In the example shown in FIG. 22 the leftmost bitline of bitline pair 0 is connected to the rightmost bitline of bitline pair 0 by short circuit 2010. Circuit 2200 produces a distinct electrical signature that indicates the presence of short circuit 2210 that connects the two bitlines of bitline pair 0.

Figure 23:
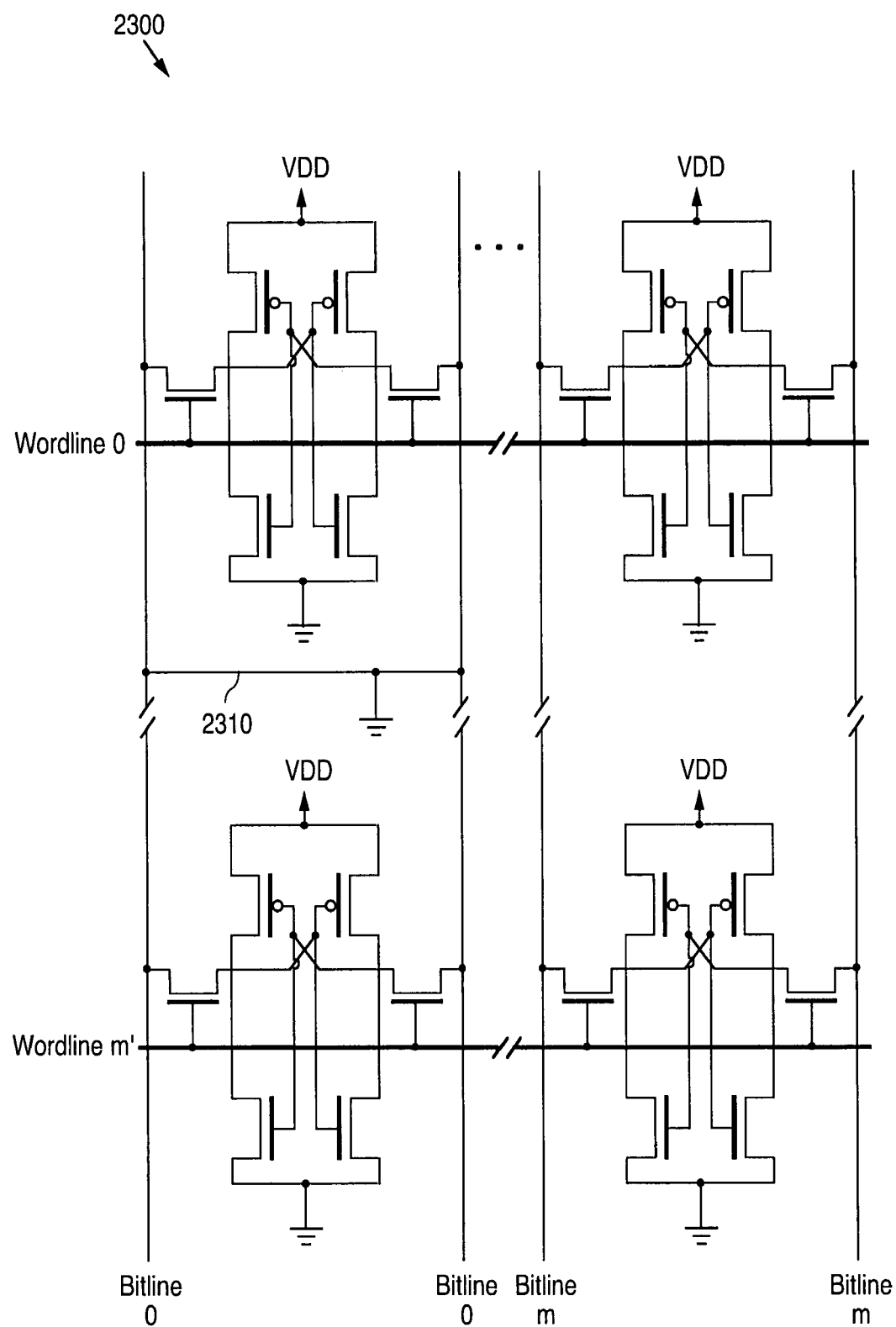
FIG. 23 illustrates a circuit that exhibits a full column fail stuck low in the memory array of bit cells of the SRAM circuit of FIG. 10.

FIG. 23 illustrates a circuit 2300 that exhibits a full column fail stuck low in the memory array 1000 of bit cells of the SRAM circuit of FIG. 10. The full column fail stuck low is generated by a short circuit 2310 that grounds the two bitlines in a bitline pair in memory array 1000. In the example shown in FIG. 23 the leftmost bitline of bitline pair 0 and the rightmost bitline of bitline pair 0 are grounded by short circuit 2310. Circuit 2300 produces a distinct electrical signature that indicates the presence of short circuit 2310 that grounds the two bitlines of bitline pair 0. The full column fail stuck low continually produces a logical zero ("0") on the two bitlines of the bitline pair 0.

Figure 24:
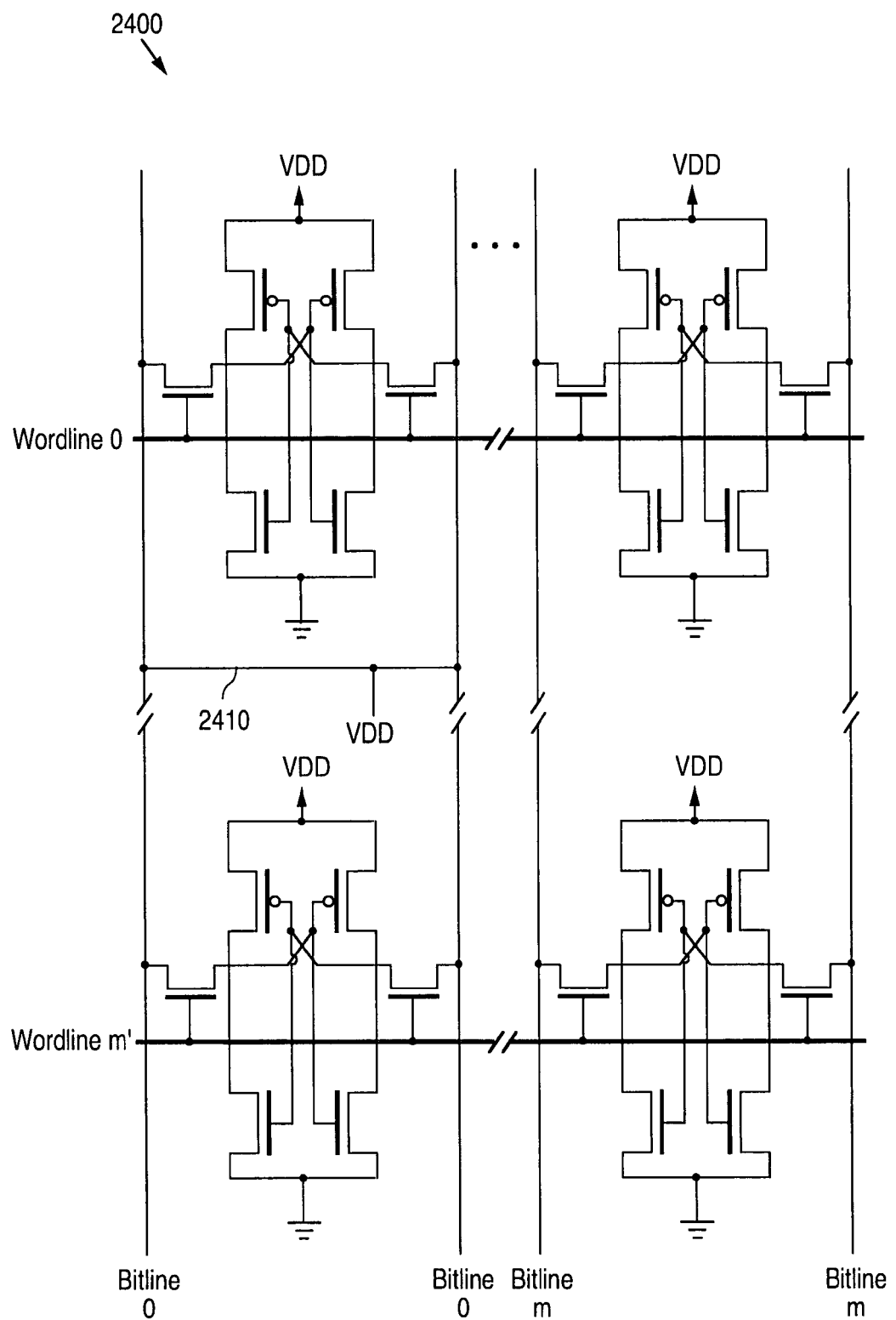
FIG. 24 illustrates a circuit that exhibits a full column fail stuck high in the memory array of bit cells of the SRAM circuit of FIG. 10.

FIG. 24 illustrates a circuit 2400 that exhibits a full column fail stuck high in the memory array 1000 of bit cells of the SRAM circuit of FIG. 10. The full column fail stuck high is generated by a short circuit 2410 that couples the two bitlines in a bitline pair in memory array 1000 to the operating voltage VDD. In the example shown in FIG. 24 the leftmost bitline of bitline pair 0 and the rightmost bitline of bitline pair 0 are connected by short circuit 2410 to the operating voltage VDD. Circuit 2400 produces a distinct electrical signature that indicates the presence of short circuit 2410 that connects the two bitlines of bitline pair 0 to the operating voltage VDD. The full column fail stuck high continually produces a logical one ("1") on the two bitlines of the bitline pair 0.

Figure 25:
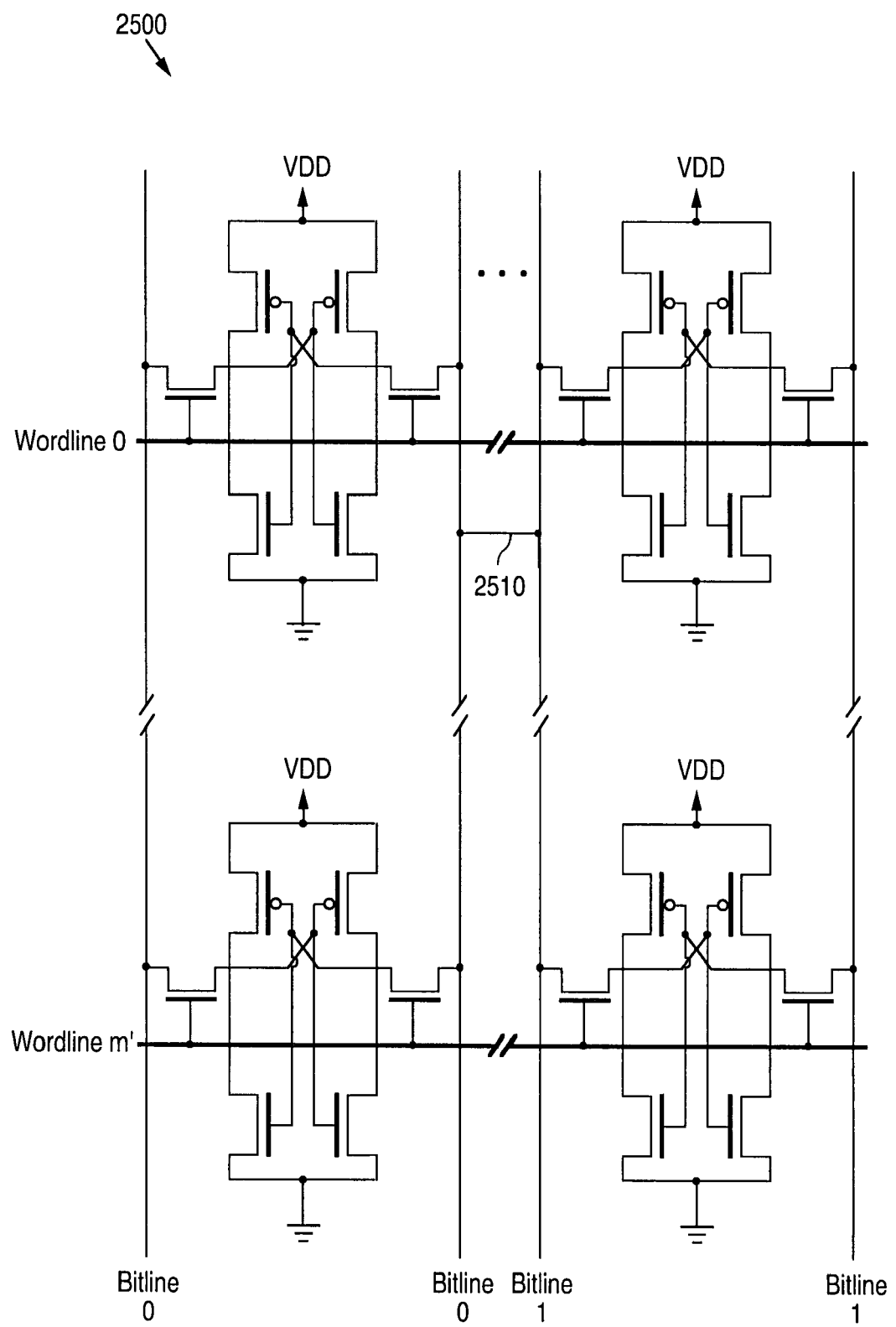
FIG. 25 illustrates a circuit that exhibits a row pair bit to bit failure (neighboring bits) in the memory array of bit cells of the SRAM circuit of FIG. 10.

FIG. 25 illustrates a circuit 2500 that exhibits a row pair bit to bit failure (neighboring bits) in the memory array 1000 of bit cells of the SRAM circuit of FIG. 10. The row pair bit to bit failure (neighboring bits) is generated by a short circuit 2510 that couples one bitline of a first bitline pair to a bitline of a second adjacent bitline pair in memory array 1000. In the example shown in FIG. 25 short circuit 2510 couples the rightmost bitline of bitline pair 0 to the leftmost bitline of bitline pair 1. Circuit 2500 produces a distinct electrical signature that indicates the presence of short circuit 2510 that connects one of the bitlines of bitline pair 0 with one of the bitlines of bitline pair 1.

Figure 26:
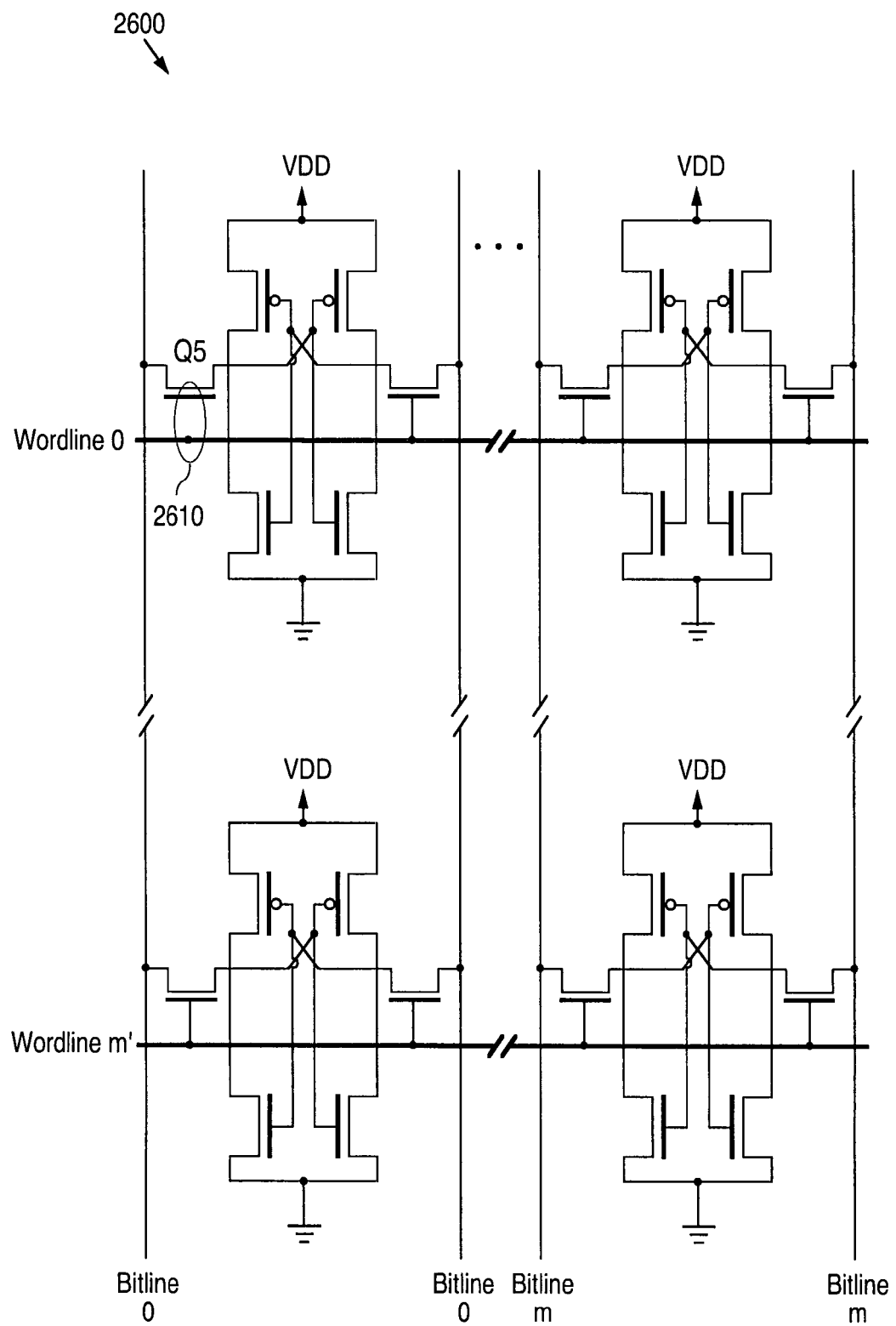
FIG. 26 illustrates a circuit that exhibits an open contact failure to passgate in the memory array of bit cells of the SRAM circuit of FIG. 10.

FIG. 26 illustrates a circuit 2600 that exhibits an open contact failure to passgate in the memory array 1000 of bit cells of the SRAM circuit of FIG. 10. The open contact failure to passgate is generated by the presence of a gap between a wordline and the passgate of one of the transistors of a bit cell. In the example shown in FIG. 26 there is a gap 2610 between wordline 0 and the gate of transistor Q5 of bit cell 100 of memory array 1000. Circuit 2600 produces a distinct electrical signature that indicates the presence of the gap 2610 between wordline 0 and the gate of transistor Q5 of bit cell 100.

Figure 27:
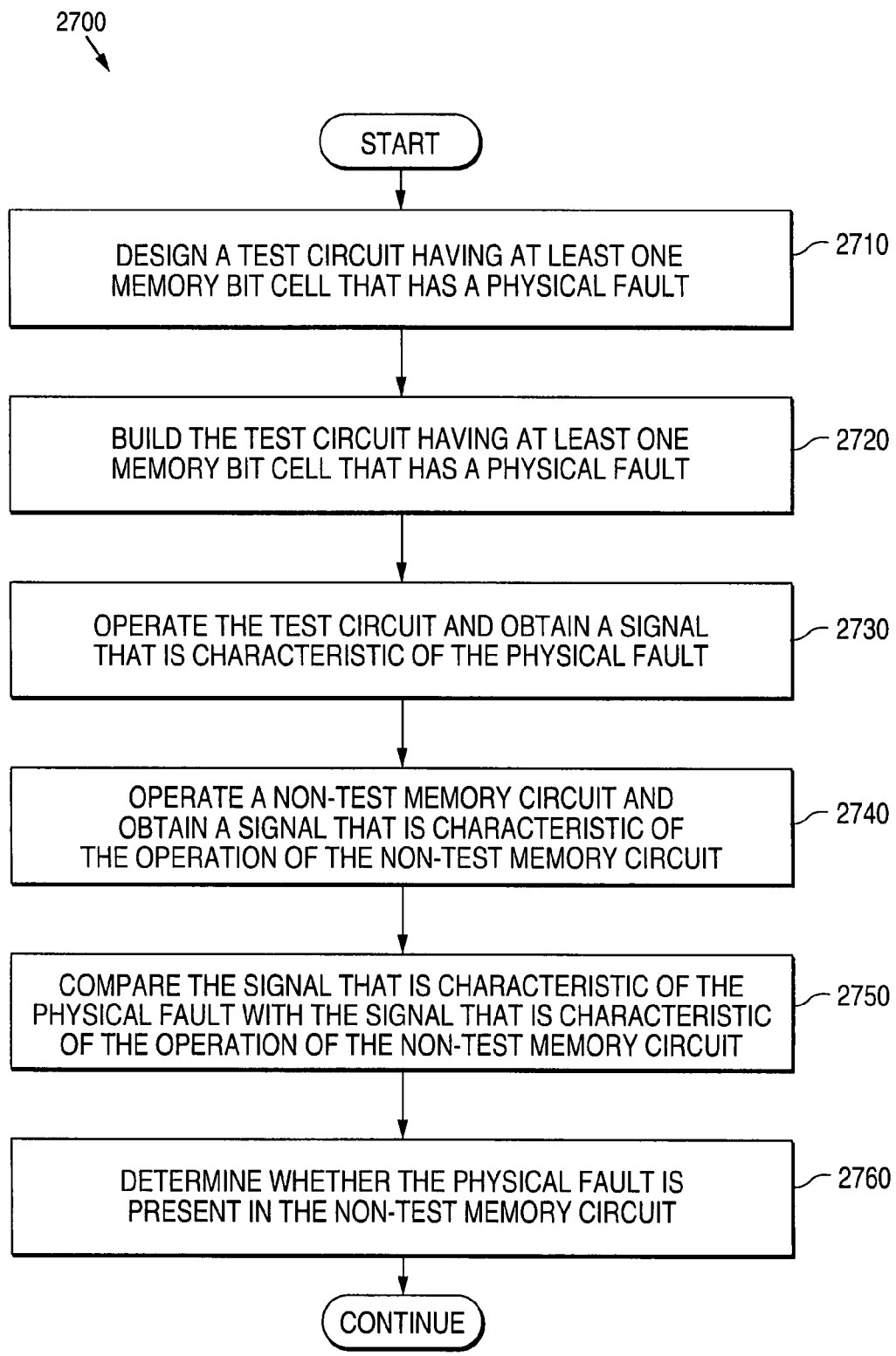
FIG. 27 illustrates a flow chart showing the steps of an advantageous embodiment of a method of the present invention.

FIG. 27 illustrates a flow chart 2700 showing the steps of an advantageous embodiment of a method of the present invention. First a test circuit is designed that has at least one memory bit cell that has a physical fault (step 2710). Then the test circuit that has at least one memory bit cell that has a physical fault is built (step 2720). Then the test circuit is operated and a signal that is characteristic of the physical fault is obtained from the test circuit (step 2730).

Then a non-test memory circuit is operated and a signal that is characteristic of the operation of the non-test memory circuit is obtained (step 2740). Then the signal that is characteristic of the physical fault in the test circuit is compared with the signal that is characteristic of the operation of the non-test memory circuit (step 2750). The comparison of signals determines whether the physical fault is present in the non-test memory circuit (step 2760).

The various embodiments of the circuits of the present invention each create a distinct electrical signature that represents a physical fault (and corresponding failure mode).

The present invention reduced the time necessary to test memory circuits compared with prior art testing and failure analysis methods. The present invention may be advantageously used in a number of ways. For example, the present invention permits a test platform and test coverage to be rapidly verified. Each distinct electrical signature represents and is characteristic of a distinct type of physical fault. The electrical signatures recreate typical yield loss mechanisms that routinely occur.

The present invention also permits the rapid verification of failure analysis capabilities. The verification includes bench testing, fault isolation, and translation of electrical failure to physical coordinates on chip. Rapid failure analysis is critical in yield enhancement activities and in reducing the time to market when new products are introduced.

The present invention also permits the simulation of defect driven yield loss mechanisms. Characterization of the electrical characteristic of each physical fault (and corresponding failure mode) is used to drive yield enhancement activities.

The present invention is also permits the simulation of defect driven yield loss mechanisms to allow testing of methods and hardware used for memory circuit repair (redundancy).

The present invention also permits the simulation of defect drive yield loss mechanisms to allow testing and verification of inline defect metrology sensitivity and recipe setup. The present invention also permits the simulation of defect drive yield loss mechanisms to significantly improve the yield learning rate, resulting in a better yield, faster time to market and better quality control.

The present invention provides a significant level of improvement when compared to prior art methods of test development, yield improvement, process development, and new product introduction.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for testing an integrated circuit memory device, comprising:
   providing a test circuit signal that is characteristic of an operation of a test circuit, the test circuit having at least one memory bit cell that has a known physical fault; and
   using the test circuit signal to identify a presence of a physical fault corresponding to the known physical fault in the integrated circuit memory device.

2. The method of claim 1, further comprising:
   providing an integrated circuit memory device signal that is characteristic of an operation of the integrated circuit memory device;
   comparing the integrated circuit memory device signal with the test circuit signal; and
   determining whether a physical fault corresponding to the known physical fault is present in the integrated circuit memory device.

3. The method of claim 1, wherein the test circuit comprises one of: a memory bit cell of a static random access memory (SRAM) device, a memory bit cell of a dynamic random access memory (DRAM) device, and a memory bit cell of a flash memory device.

4. The method of claim 1, wherein the known physical fault comprises a single bit failure in the at least one memory bit cell.

5. The method of claim 4, wherein the known physical fault comprises a single bit failure stuck low in the at least one memory bit cell.

6. The method of claim 4, wherein the known physical fault comprises a single bit failure stuck high in the at least one memory bit cell.

7. The method of claim 1, wherein the known physical fault comprises one of: a full row low failure in the at least one memory bit cell and a full row high failure in the at least one memory bit cell.

8. The method of claim 1, wherein the known physical fault comprises one of: a full column low failure in the at least one memory bit cell and a full column high failure in the at least one memory bit cell.

9. The method of claim 1, wherein the known physical fault comprises a row pair bit failure in a memory array of bit cells.

10. The method of claim 1, wherein the known physical fault comprises a column pair bit failure in a memory array of bit cells.

11. The method of claim 10, wherein the known physical fault comprises a column pair bit failure stuck low in the memory array of bit cells.

12. The method of claim 10, wherein the known physical fault comprises a column pair bit failure stuck high in the memory array of bit cells.

13. The method of claim 1, wherein the known physical fault comprises a diagonal pair bit failure in a memory array of bit cells.

14. The method of claim 13, wherein the known physical fault comprises a diagonal pair bit failure stuck low in the memory array of bit cells.

15. The method of claim 13, wherein the known physical fault comprises a diagonal pair bit failure stuck high in the memory array of bit cells.

16. The method of claim 1, wherein the known physical fault comprises one of: a full row failure wordline stuck low in a memory array of bit cells and a full row failure wordline stuck high in the memory array of bit cells.

17. The method of claim 1, wherein the known physical fault comprises one of: a full column failure bitline stuck low in a memory array of bit cells and a full column failure bitline stuck high in the memory array of bit cells.

18. The method of claim 1, wherein the known physical fault comprises one of: a full column failure stuck low in a memory array of bit cells and a full column failure stuck high in the memory array of bit cells.

19. The method of claim 1, wherein the known physical fault comprises a row pair bit to bit failure in a memory array of bit cells.

20. The method of claim 1, wherein the known physical fault comprises an open contact failure to passgate in a memory array of bit cells.

21. A method for testing an integrated circuit memory device, comprising:
providing a plurality of test circuit signals that are each characteristic of an operation of a test circuit having at least one memory bit cell with a different known physical fault; and
using the test circuit signals to identify a presence of at least one physical fault corresponding to at least one of the known physical faults in the integrated circuit memory device.

22. The method of claim 21, further comprising:
providing an integrated circuit memory device signal that is characteristic of an operation of the integrated circuit memory device;
comparing the integrated circuit memory device signal with more than one of the plurality of the test circuit signals; and
determining whether a physical fault corresponding to one of the known physical faults is present in the integrated circuit memory device.

23. A method comprising:
comparing an integrated circuit memory device signal to a test circuit signal, the integrated circuit memory device signal associated with operation of an integrated circuit memory device, the test circuit signal associated with operation of a test circuit having at least one memory bit cell with a known physical fault; and
determining whether a physical fault corresponding to the known physical fault is present in the integrated circuit memory device.

* * * * *